(12) United States Patent
Coover et al.

(10) Patent No.: US 11,481,628 B2
(45) Date of Patent: Oct. 25, 2022

(54) METHODS AND APPARATUS FOR AUDIO EQUALIZATION BASED ON VARIANT SELECTION

(71) Applicant: Gracenote, Inc., Emeryville, CA (US)

(72) Inventors: Robert Coover, Orinda, CA (US);
Joseph Renner, Oakland, CA (US);
Cameron A. Summers, Oakland, CA (US)

(73) Assignee: Gracenote, Inc., Emeryville, CA (US)

( * ) Notice: Subject to any disclaimer, the term of this patent is extended or adjusted under 35 U.S.C. 154(b) by 414 days.

(21) Appl. No.: 16/696,711

(22) Filed: Nov. 26, 2019

(65) Prior Publication Data

US 2021/0158148 A1    May 27, 2021

(51) Int. Cl.
| | |
|---|---|
| *G06N 3/08* | (2006.01) |
| *G06N 3/04* | (2006.01) |
| *H03G 5/16* | (2006.01) |
| *G06F 3/16* | (2006.01) |
| *G10L 25/51* | (2013.01) |
| *G10L 25/30* | (2013.01) |

(52) U.S. Cl.
CPC ............. *G06N 3/08* (2013.01); *G06N 3/04* (2013.01); *H03G 5/165* (2013.01); *G06F 3/165* (2013.01); *G10L 25/30* (2013.01); *G10L 25/51* (2013.01)

(58) Field of Classification Search
CPC . G06N 3/08; G06N 3/04; H03G 5/165; G06F 3/165; G10L 25/30; G10L 25/51
USPC ........................................................ 706/23
See application file for complete search history.

(56) References Cited

U.S. PATENT DOCUMENTS

| | | | |
|---|---|---|---|
| 5,532,950 A | 7/1996 | Moses et al. | |
| 9,258,607 B2 | 2/2016 | Chen | |
| 9,380,383 B2 | 6/2016 | Brenner et al. | |
| 9,443,517 B1 | 9/2016 | Foerster et al. | |
| 10,798,484 B1 | 10/2020 | Coover et al. | |
| 2002/0049974 A1 | 4/2002 | Shnier | |

(Continued)

FOREIGN PATENT DOCUMENTS

| | | |
|---|---|---|
| KR | 20140134988 | 11/2014 |
| KR | 101915120 | 11/2018 |
| WO | 9517054 | 6/1995 |

OTHER PUBLICATIONS

The Spotify Community, "Equalizer auto preset by music genre," [https://community.spotify.com/t5/Closed-Ideas/Equaiizer-auto-preset-by-music-genre/idip/894673], Aug. 22, 2014, 7 pages.

(Continued)

*Primary Examiner* — Paul Kim
(74) *Attorney, Agent, or Firm* — Hanley, Flight & Zimmerman, LLC

(57) ABSTRACT

Methods, apparatus, systems and articles of manufacture are disclosed methods and apparatus for audio equalization based on variant selection. An example apparatus includes a processor to obtain training data, the training data including a plurality of reference audio signals each associated with a variant of music and organize the training data into a plurality of entries based on the plurality of reference audio signals, a training model executor to execute a neural network model using the training data, and a model trainer to train the neural network model by updating at least one weight corresponding to one of the entries in the training data when the neural network model does not satisfy a training threshold.

28 Claims, 9 Drawing Sheets

(56) References Cited

U.S. PATENT DOCUMENTS

| | | | |
|---|---|---|---|
| 2002/0159607 | A1 | 10/2002 | Ford et al. |
| 2004/0170381 | A1 | 9/2004 | Srinivasan |
| 2008/0002839 | A1 | 1/2008 | Eng |
| 2008/0075303 | A1 | 3/2008 | Kim et al. |
| 2011/0029111 | A1 | 2/2011 | Sabin et al. |
| 2016/0056787 | A1 | 2/2016 | Lu et al. |
| 2016/0373197 | A1 | 12/2016 | Brenner et al. |
| 2017/0070817 | A1* | 3/2017 | Seo .......... H03G 3/32 |
| 2021/0158148 | A1 | 5/2021 | Coover et al. |
| 2021/0160615 | A1 | 5/2021 | Coover et al. |

OTHER PUBLICATIONS

International Searching Authority, "International Search Report", issued in connection with International Application No. PCT/US2020/062360, dated Apr. 5, 2021, 12 pages.

International Searching Authority, "Written Opinion", issued in connection with International Application No. PCT/US2020/062360, dated Apr. 5, 2021, 4 pages.

United States Patent and Trademark Office, "Notice of Allowance and Fee(s) Due", issued in connection with U.S. Appl. No. 16/696,774, dated Jun. 5, 2020, (7 pages).

United States Patent and Trademark Office, "Corrected Notice of Allowability", issued in connection with U.S. Appl. No. 16/696,774, dated Jun. 17, 2020, (5 pages).

United States Patent and Trademark Office, "Non-Final Office Action", issued in connection with U.S. Appl. No. 17/039,549, dated Oct. 25, 2021, (7 pages).

United States Patent and Trademark Office, "Notice of Allowance and Fee(s) Due", issued in connection with U.S. Appl. No. 17/039,549, dated Feb. 15, 2022, (7 pages).

United States Patent and Trademark Office, "Corrected Notice of Allowability", issued in connection with U.S. Appl. No. 17/039,549, dated May 20, 2022, (2 pages).

Rajanna et al., "Deep Neural Networks: A Case Study for Music Genre Classification," 2015 IEEE 14th International Conference on machine Learning and Applications (ICMLA), Dec. 11, 2015, (6 pages).

Välimäki et al., "Neurally Controlled Graphic Equalizer," IEEE/ACM Transactions on Audio, Speech, and Language Processing, vol. 27, No. 12, Dec. 2019, (10 pages).

* cited by examiner

METHODS AND APPARATUS FOR AUDIO EQUALIZATION BASED ON VARIANT SELECTION

FIELD OF THE DISCLOSURE

This disclosure relates generally to media, and, more particularly, to methods and apparatus for audio equalization based on variant selection.

BACKGROUND

In recent years, a multitude of media of varying characteristics has been delivered using an increasing number of sources. Media can be received using more traditional sources (e.g., the radio), or using more recently developed sources, such as using Internet-connected streaming devices. As these sources have developed, systems which are able to process and output audio from multiple sources have been developed as well. These audio signals may have differing characteristics (e.g., dynamic range, volume, etc.). Some automobile media systems, for example, are capable of delivering media from compact discs (CD's), Bluetooth connecting devices, universal serial bus (USB) connected devices, Wi-Fi connected devices, auxiliary inputs, and other sources.

Figure 1:
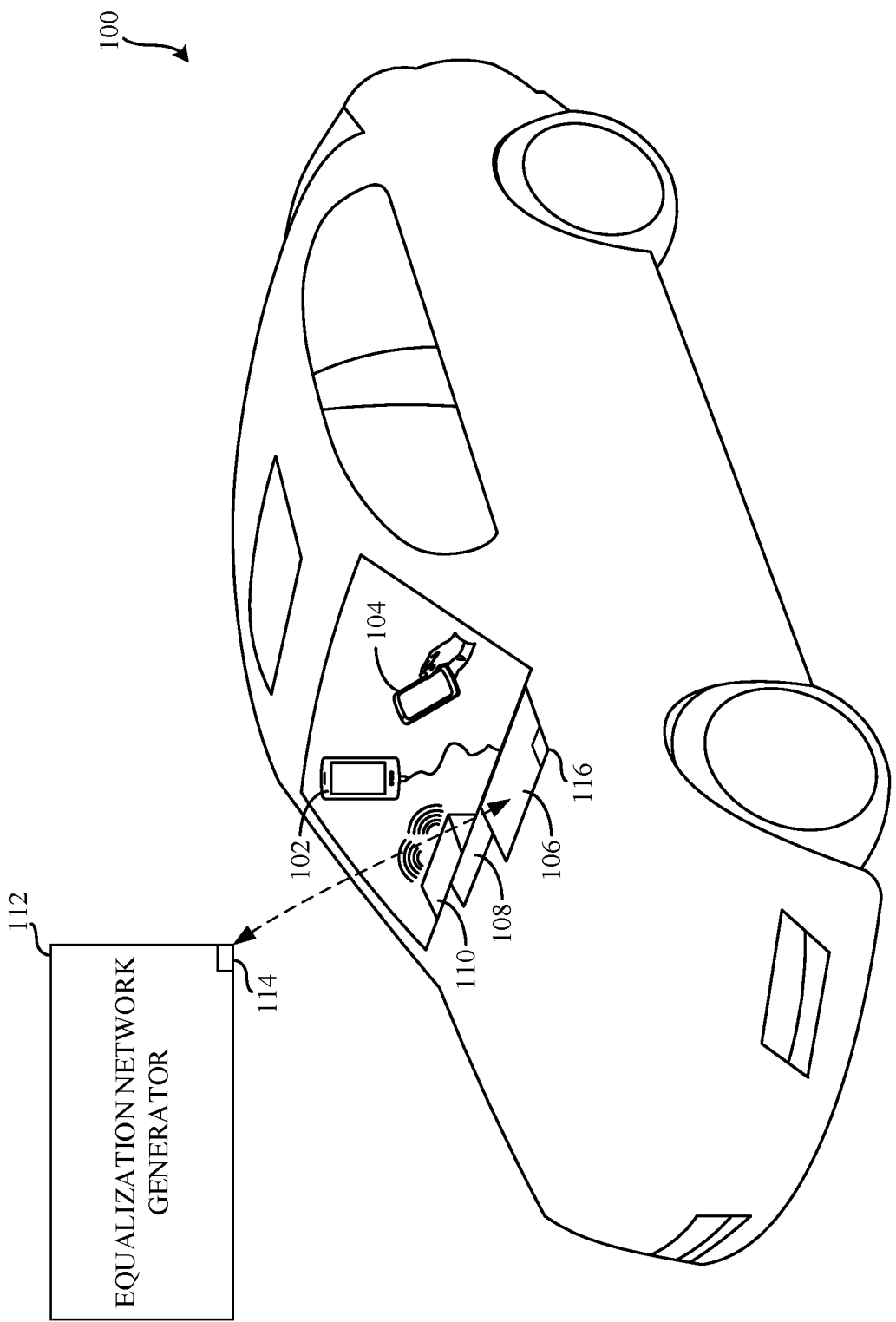
FIG. 1 is a schematic illustration of an example environment for implementing techniques disclosed herein for audio equalization.

The figures are not to scale. Instead, the thickness of the layers or regions may be enlarged in the drawings. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

In conventional audio processing implementations, audio signals associated with different media may have different characteristics. For example, different audio tracks may have different frequency profiles (e.g., varying volume levels at different frequencies of the audio signal), different overall (e.g., average) volumes, pitch, timbre, etc. For example, media on one CD may be recorded and/or mastered differently than media from another CD. Similarly, media retrieved from a streaming device may have significantly different audio characteristics than media retrieved from an uncompressed medium such as a compact disc (CD), and may also differ from media retrieved from the same device via a different application and/or audio compression level.

As users increasingly listen to media from a variety of different sources and from a variety of genres and types, differences in audio characteristics between sources and between media of the same source can become very noticeable, and potentially irritating to a listener. Audio equalization is a technique utilized to adjust volume levels of different frequencies in an audio signal. For example, equalization can be performed to increase the presence of low frequency signals, mid-frequency signals, and/or high-frequency signals based on a preference associated with a genre of music, an era of music, a user preference, a space in which the audio signal is output, etc. However, the optimal or preferred equalization settings may vary depending on the media being presented. Hence, a listener may need to frequently adjust equalization settings to optimize the listening experience based on a change in media (e.g., a change in the genre, a change in era, a change in overall volume of the track, etc.).

In some conventional approaches, an equalization setting can be selected that is associated with a specific genre or type of music. For example, in a media unit on a vehicle, a listener may be able to select an equalizer for "Rock," which is configured to boost frequencies that a user may want to hear more of, and cut other frequencies which may be overpowering, based on typical characteristics of Rock music.

In example methods, apparatus, systems, and articles of manufacture disclosed herein, incoming audio signals (e.g., from a storage device, from a radio, from a streaming service, etc.) are analyzed and equalized. The techniques disclosed herein analyze incoming audio signals to determine average volume values during a buffer period for a plurality of frequency ranges, standard deviation values during the buffer period for the plurality of frequency ranges, and an energy of the incoming audio signal. By utilizing average frequency values over the buffer period, sudden short-term changes in the incoming audio signal are smoothed out when determining an equalization curve to apply, thereby avoiding drastic changes in the equalization settings.

Example methods, apparatus, systems, and articles of manufacture disclosed herein improve audio equalization techniques by dynamically adjusting equalization settings to account for changes in audio characteristics (e.g., genre, era, mood, etc.) providing the incoming audio signal or characteristics (e.g., genre, era, mood, etc.) of media represented in the incoming audio signal. Example techniques disclosed herein utilize a neural network intelligently trained on audio signals equalized by expert audio engineers, enabling the neural network to learn preferences and skills from various audio engineers.

Example methods, apparatus, systems, and articles of manufacture disclosed herein generate an input feature set including the average volume values during the buffer period for the plurality of frequency ranges and/or the standard deviation values during the buffer period for the plurality of frequency ranges and input the input feature set into a neural network. The example methods, apparatus, systems, and articles of manufacture disclosed herein utilize a neural network trained on a plurality of reference audio signals and a plurality of equalization curves generated by audio engineers each associated with a respective variant of music (e.g., a specific music genre or type of music). In some examples, the reference audio signals and corresponding equalization curves are tagged (e.g., associated) with an indication of the specific audio engineer that generated the equalization curve, to enable the neural network to learn the different equalization styles and preferences of the different audio engineers. In this manner, a user may select a preferred equalization curve, audio engineer, etc., or a variant of an equalization curve, audio engineer, etc. based on a preference (e.g., a preferred genre and/or music type). Such a selection may be applied by adjusting a weight of an input to a single neural network model. Furthermore, in examples disclosed herein, such a selection is included in the input feature set and provided to the neural network model. In this manner, a single neural network model may be utilized to adjust audio equalization settings responsive to a user preference input. As such, examples disclosed herein utilize fewer neural network models (e.g., a single neural network model) to operate in response to a user input.

Examples disclosed herein include assigning, altering, and/or otherwise adjusting a weight of data input into a neural network model based on a user input. For example, if a user prefers to listen to a specific type of music (e.g., Rock music), such an input would be obtained via a user interface. Before the input is sent to the neural network model (e.g., before the input is included in the input feature set), examples disclosed herein generate a matrix in which the location corresponding to the audio engineers and/or equalization curves best suited for Rock music is identified with a higher weight. For example, there may be ten audio engineers associated with ten equalization curves. In such an example, each equalization curve may be better suited for a particular genre and/or music type (e.g., two audio engineers may specialize in Rock music, one audio engineer may specialize in Country music, etc.). Further in such an example, if a user prefers to listen to music with associated with the genre "Rock" (e.g., the user input indicates a preferred variant of "Rock" music), corresponding equalization curves generated by audio engineers known to engineer mainly "Rock" may be tagged and weighted in the matrix. In the above-mentioned example of ten audio engineers, if the first and third audio engineers are known to create equalization curves for mainly "Rock" music, then a matrix may be generated by adjusting and/or otherwise assigning a higher weight to the equalization curves associated with the first and third audio engineers (e.g., [1, 0, 1, 0, 0, 0, 0, 0, 0, 0], [0.5, 0, 0.47, 0, 0, 0, 0, 0, 0, 0], etc.).

In examples disclosed herein, the matrix generated in response to a user input may be referred to as a one-hot matrix. Further, such an example one-hot matrix may be any suitable matrix (e.g., a 1×n matrix) in which the number of entries (e.g., "n") is equivalent to the number of audio engineers, equalization curves, music genres, music types, etc. In this manner, the "n" equalization curves will be input into a single neural network model and, as such, may be trained using a singular set of data. In examples disclosed herein, the use of a singular neural network trained using a plurality of equalization curves, audio engineers, music genres, music types, etc., and a corresponding one-hot matrix, enable the use of significantly less processing power and memory when training and/or utilizing a neural network model. Such an example enables the use of a singular neural network model to be adjusted (e.g., weights of input equalization curves adjusted based on a one-hot matrix) responsive to a user preferred input. As an added benefit, only one neural network is needed, as opposed to a separate neural network for each element of the one-hot matrix (e.g., corresponding to each audio engineer). Furthermore, using a single neural network enables blends of different audio engineers and/or audio engineering styles to be selected. In other examples disclosed herein, the matrix, or one-hot matrix, may be implemented using any suitable data structure such as, for example, a tree graph, an array, a string, etc.

FIG. 1 is a schematic illustration of an example environment 100 for implementing techniques disclosed herein for audio equalization. The example environment 100 includes media devices 102, 104 that transmit audio signals to a media unit 106. The media unit 106 processes the audio signals (e.g., performing audio equalization techniques as disclosed herein) and transmits the signals to an audio amplifier 108, which subsequently outputs the amplified audio signal to be presented via an output device 110. The environment 100 further includes an example equalization network generator 112 configured to preforming training operations on an example neural network model 114. In the example of FIG. 1, the media unit 106 includes an example trained neural network model 116.

The example media device 102 of the illustrated example of FIG. 1 is a portable media player (e.g., an MP3 player). The example media device 102 stores and/or receives audio signals corresponding to media, and is capable of transmitting the audio signals to other devices. In the illustrated example of FIG. 1, the media device 102 transmits audio signals to the media unit 106 via an auxiliary cable. In some examples, the media device 102 may transmit audio signals to the media unit 106 via any other interface (e.g., wireless communication, Bluetooth® communication, etc.). In some examples, the media device 102 and the media unit 106 may be the same device. For example, the media unit 106 may be a mobile device, which is capable of performing audio equalization techniques disclosed herein on audio being presented on the mobile device.

The example media device 104 of the illustrated example of FIG. 1 is a mobile device (e.g., a cell phone). The example media device 104 stores and/or receives audio signals corresponding to media, and is capable of transmitting the audio signals to other devices. In the illustrated example of FIG. 1, the media device 104 transmits audio signals to the media unit 106 wirelessly. In some examples, the media device 104 may use Wi-Fi, Bluetooth, and/or any other technology to transmit audio signals to the media unit 106. In some examples, the media device 104 may interact with components of a vehicle or other devices for a listener to select media for presentation in the vehicle. The media devices 102, 104 may be any devices which are capable of storing and/or accessing audio signals. In some examples, the media devices 102, 104 may be integral to the vehicle (e.g., a CD player, a radio, etc.).

The example media unit 106 of the illustrated example of FIG. 1 is capable of receiving audio signals and processing the audio signal to perform audio equalization. In addition, the media unit 106 is a device capable of receiving a user input indicative of a preferred music genre and/or music type. For example, the media unit 106 includes a user interface which enables a user and/or otherwise audio listener to enter a preferred music genre and/or music type. In the illustrated example of FIG. 1, the example media unit 106 receives media signals from the media devices 102, 104 and processes them to perform audio equalization techniques as disclosed herein. In such examples, the media unit 106 processes received media signals from the media devices 102, 104, along with a received user input (e.g., a preferred genre and/or music type, a variant selection, etc.) to perform audio equalization techniques as disclosed herein. In some examples, the example media unit 106 is implemented as software and is included as part of another device, available either through a direct connection (e.g., a wired connection) or through a network (e.g., available on the cloud). In some examples, the example media unit 106 may be incorporated with the audio amplifier 108 and the output device 110 and may output audio signals itself following processing of the audio signals.

The example audio amplifier 108 of the illustrated example of FIG. 1 is a device that is capable of receiving the audio signal that has been processed (e.g., equalized) by the media unit 106 and performing the appropriate playback setting adjustments (e.g., volume adjustments based on a user input) for output on the output device 110. In some examples, the audio amplifier 108 may be incorporated into the output device 110. In some examples, the audio is output directly from the media unit 106, instead of being communicated to an amplifier.

The example output device 110 of the illustrated example of FIG. 1 is a speaker. In some examples, the output device 110 may be multiple speakers, headphones, or any other device capable of presenting audio signals to a listener. In some examples, the output device 110 may be capable of outputting visual elements as well (e.g., a television with speakers). In some examples, the output device 110 may be integrated in the media unit 106. For example, if the media unit 106 is a mobile device, the output device 110 may be a speaker integrated in or otherwise connected with (e.g., via Bluetooth, auxiliary cable, etc.) the mobile device. In some such examples, the output device 110 may be headphones connected to the mobile device.

In the example illustrated in FIG. 1, the equalization network generator 112 is a device capable of preforming training techniques on the neural network model 114. For example, the equalization network generator 112 may be a neural network configured to obtain a plurality of equalization curves from a plurality of audio engineers each associated with a respective variant of music (e.g., a specific music genre or type of music). In such an example, the plurality of equalization curves is provided to the equalization network generator 112 in order to train the neural network model 114. The equalization network generator 112 may be implemented using any suitable number of servers, processors, datacenters, and/or computing devices in order to train the neural network model 114. In other examples disclosed herein, the equalization network generator 112 may be implemented within the media unit 106 and/or any suitable device located in the environment 100.

While the illustrated example environment 100 of FIG. 1 is described in reference to an audio equalization implementation in a vehicle, some or all of the devices included in the example environment 100 may be implemented in any environment, and in any combination. For example, the media unit 106, along with any of the audio amplifier 108 and/or the output device 110 may be implemented in a mobile phone, which can perform audio equalization utilizing techniques disclosed herein on any media being presented from the mobile device (e.g., streaming music, media stored locally on the mobile device, radio, etc.). In some examples, the environment 100 may be in an entertainment room of a house, wherein the media devices 102, 104 may be gaming consoles, virtual reality devices, set top boxes, or any other devices capable of accessing and/or transmitting media. In some examples, the media unit 106 is a sound bar. Additionally, in some examples, the media may include visual elements as well (e.g., television shows, films, etc.).

Figure 2:
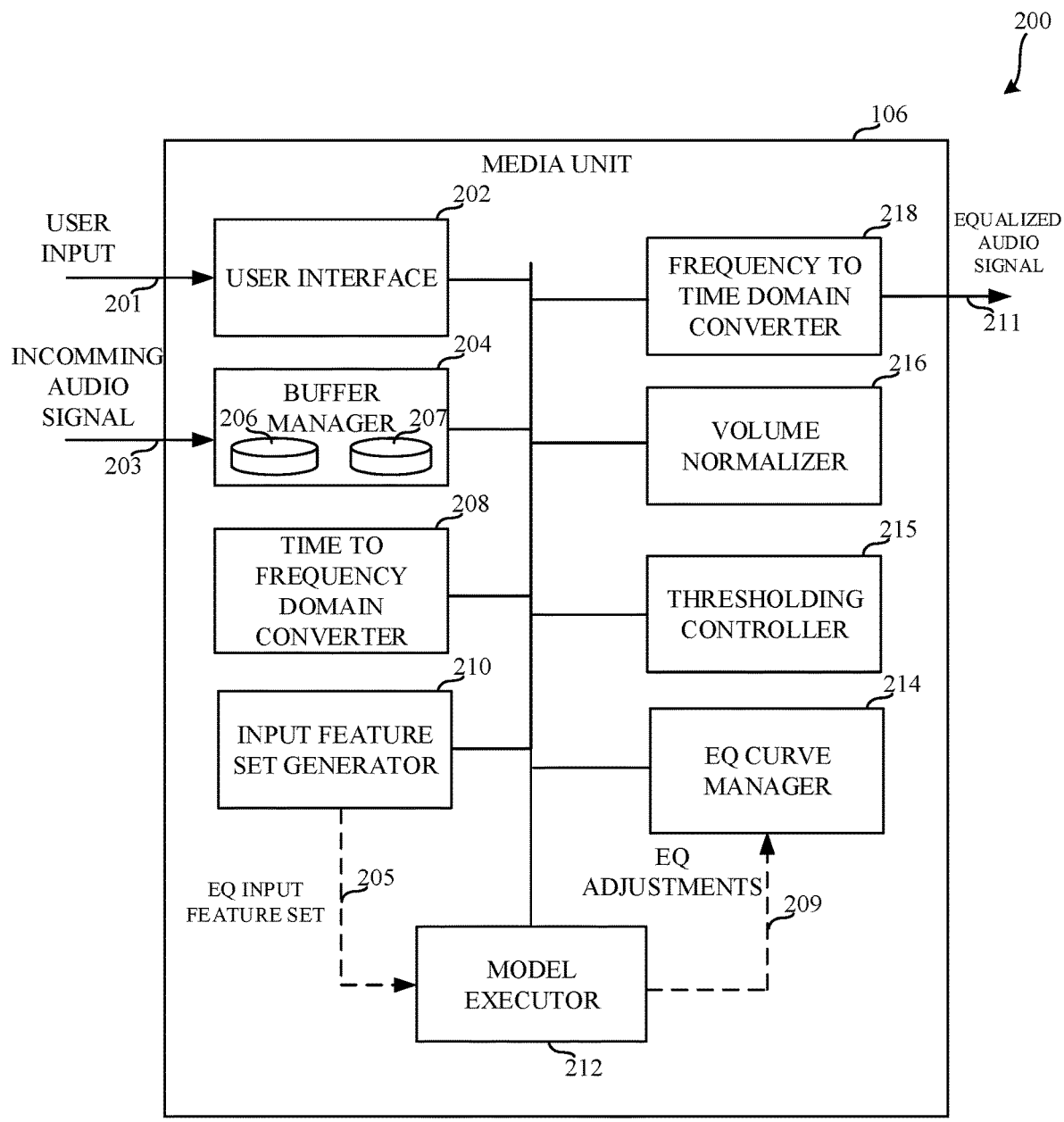
FIG. 2 is a block diagram of the example media unit of FIG. 1 structured to perform techniques for audio equalization in accordance with the teachings of this disclosure.

FIG. 2 is a block diagram of the example media unit 106 of FIG. 1 structured to perform techniques for audio equalization in accordance with the teachings of this disclosure. The example media unit 106 includes an example user interface 202, an example buffer manager 204, an example first datastore 206, an example second datastore 207, an example time to frequency domain converter 208, an example input feature set generator 210, an example EQ curve manager 214, an example thresholding controller 215, an example volume normalizer 216, and an example frequency to time domain converter 218.

In the example of FIG. 2, the user interface 202 obtains an example user input 201 from a user indicating a selected variant of music. In examples disclosed herein, the user input 201 identifies a selected variant of music such as, for example, a genre (e.g., Rock, Classical, etc.). However, in other examples disclosed herein, the user input 201 may identify any selected variant of music such as, for example, a mood (e.g., peaceful, calm, serious, etc.), tempo (e.g., fast, slow, etc.), timbre, etc. The user interface 202 receives the user input 201 in the form of a tactile input. For example, the user interface 202 may be a graphical user interface (GUI) which displays example variants for a user to select from. In other examples disclosed herein, the user input 201 may be obtained via a select knob, a scroll wheel, a pushbutton, etc. In some examples disclosed herein, the user interface 202 may prompt a user for the user input 201. For example, the user interface 202 may provide text-prompt requesting the user input 201 from the user. Further in such an example, the user interface 202 may provide any suitable prompt (e.g., illuminate a light, emit a sound, etc.) to request the user input 201 from the user. In examples disclosed herein, the user interface 202 determines whether the user input 201 is received and/or otherwise entered by the user. In examples disclosed herein, the user interface 202 may be an example means for interfacing.

The example buffer manager 204 of the illustrated example of FIG. 2 receives an example incoming audio signal 203 and stores a portion of the incoming audio signal 203 in the first datastore 206 and/or the second datastore 207. The buffer manager 204 can configure the buffers (e.g., the portion of the incoming audio signal 203) to represent any duration (e.g., ten seconds, thirty seconds, one minute, etc.). The portion of the incoming audio signal 203 that is stored in the buffers in the first datastore 206 and/or second datastore 207 is/are utilized to determine equalization features, thereby enabling the equalization features to be representative of a longer duration of the incoming audio signal 203 than if the features were generated based on instantaneous characteristics of the incoming audio signal 203. The duration of the buffer may be tuned based on how responsive the equalization should be. For example, a very brief buffer duration may result in drastic changes in the equalization curve when spectral characteristics of the incoming audio signal 203 change (e.g., during different portions of a song), while a long buffer period averages out these large changes in the incoming audio signal 203 and provides more consistent equalization profiles. The buffer manager 204 can cause portions of the incoming audio signal 203 which are no longer within the buffer period to be discarded. For example, if the buffer period is ten seconds, once a portion of the incoming audio signal 203 has been in the buffer for ten seconds, this portion will be removed. In examples disclosed herein, the buffer manager 204 may be an example means for managing.

In examples disclosed herein, a neural network is utilized to identify media changes (e.g., track changes, changes in the audio characteristics, etc.) and the output is utilized to adjust the equalization in response to the change in media. For example, when a new track is detected by the neural network, short-term instantaneous or average volume (e.g., volume values at frequency ranges throughout a period shorter than the standard buffer period, standard deviation values at frequency ranges throughout the shorter period, etc.) can be calculated to cause a quick adjustment in an example equalization input feature set (EQ input feature set) 205 and consequently in example EQ adjustments 209 (e.g., audio gains and/or cuts). In yet another example, the media unit 106 may identify that a change in signal has occurred. In this manner, any audio stored in the media unit 106 (e.g., any audio stored in one or more buffers of the media unit) may be cleared (e.g., deleted, emptied, etc.) to prevent previously identified statistics (e.g., mean, standard deviation of amplitudes of frequencies, etc.) of the previous audio signal and/or audio source from being affecting the determination of the EQ adjustments 209 (e.g., audio gains and/or cuts).

Likewise, when a new user input 201 is received, changes in the corresponding one-hot matrix can be quickly calculated to cause an adjustment in the EQ input feature set 205 and consequently in the example EQ adjustments 209 (e.g., audio gains and/or cuts).

In some examples, in addition to or alternatively to utilizing a neural network to identify media changes, a hysteresis-based logic can be implemented to cause faster equalization changes when a more drastic change in characteristics of media represented in the incoming audio signal 203 occurs (e.g., a transition from bass-heavy to treble-heavy media).

The example first datastore 206 of the illustrated example of FIG. 2 is a storage location for the incoming audio signal 203. In examples disclosed herein, the first datastore 206 stores first portions (e.g., milliseconds, microseconds, etc.) worth of the incoming audio signal 203 in the time domain. In such an example, the first datastore 206 stores the first portions (e.g., milliseconds, microseconds, etc.) of the incoming audio signal 203 until there is enough duration for the time to frequency domain converter 208 to convert the incoming audio signal 203. In examples disclosed herein, the first datastore 206 stores the first portions of the incoming audio signal 203 until the incoming audio signal 203 has been successfully transformed to the frequency domain. In such an event, the incoming audio signal 203 is equalized and transformed back into the time domain, to be sent as the equalized audio signal 211.

The first datastore 206 may be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory). The first datastore 206 may additionally or alternatively be implemented by one or more double data rate (DDR) memories, such as DDR, DDR2, DDR3, mobile DDR (mDDR), etc. The first datastore 206 may additionally or alternatively be implemented by one or more mass storage devices such as hard disk drive(s), compact disk drive(s) digital versatile disk drive(s), etc. While in the illustrated example the first datastore 206 is illustrated as a single database, the first datastore 206 may be implemented by any number and/or type(s) of databases. Furthermore, the data stored in the first datastore 206 may be in any data format such as, for example, binary data, comma delimited data, tab delimited data, structured query language (SQL) structures, etc. In examples disclosed herein, the first datastore 206 may be an example first means for storing audio.

The example second datastore 207 of the illustrated example of FIG. 2 is a storage location for the incoming audio signal 203. In examples disclosed herein, the second datastore 207 stores second portions (e.g., seconds, etc.) worth of the incoming audio signal 203 in the frequency domain. In such an example, the second datastore 207 stores the second portions (e.g., second, etc.) of the incoming audio signal 203 to provide relevant statistics (e.g., average, standard deviation, etc.) of the incoming audio signal 203 to the model executor 212. The second datastore 207 can be updated (e.g., information may be added and/or removed) at regular intervals to ensure the relevant statistics (e.g., average, standard deviation, etc.) reflect the most recent audio signal.

The second datastore 207 may be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory). The second datastore 207 may additionally or alternatively be implemented by one or more double data rate (DDR) memories, such as DDR, DDR2, DDR3, mobile DDR (mDDR), etc. The second datastore 207 may additionally or alternatively be implemented by one or more mass storage devices such as hard disk drive(s), compact disk drive(s) digital versatile disk drive(s), etc. While in the illustrated example the second datastore 207 is illustrated as a single database, the second datastore 207 may be implemented by any number and/or type(s) of databases. Furthermore, the data stored in the second datastore 207 may be in any data format such as, for example, binary data, comma delimited data, tab delimited data, structured query language (SQL) structures, etc. In examples disclosed herein, the second datastore 207 may be an example second means for storing audio.

The example time to frequency domain converter 208 of the illustrated example of FIG. 2 converts and/or otherwise outputs the incoming audio signal 203 from a time-domain representation to a frequency-domain representation. In some examples, the time to frequency domain converter 208 utilizes a Fast Fourier Transform (FFT). In some examples, the time to frequency domain converter 208 converts the incoming audio signal 203 into a linear-spaced and/or log-spaced frequency domain representation. The time to frequency domain converter 208 may utilize any type of transform (e.g., a short-time Fourier Transform, a Constant-Q transform, Hartley transform, etc.) to convert the incoming audio signal 203 from a time-domain representation to a frequency-domain representation. In some examples, the media unit 106 may alternatively perform the audio equalization techniques disclosed herein in the time-domain. In examples disclosed herein, the time to frequency domain converter 208 may be an example means for frequency converting.

The example input feature set generator 210 of the illustrated example of FIG. 2 generates audio features corresponding to the incoming user input 201 and the incoming audio signal 203 to input to an example EQ neural network (e.g., the trained neural network model 116 executed by the model executor 212). The input feature set generator 210 communicates with the user interface 202 to obtain the user input 201. In this manner, the input feature set generator 210 provides a signal representation corresponding to the user input 201 to the equalization network generator 112. In examples disclosed herein, the input feature set generator 210 generates a signal representation in the form of a one-hot matrix, corresponding to the user input. For example, the one-hot matrix may be any suitable matrix and/or vector (e.g., a 1×n matrix) in which the number of entries (e.g., "n") is equivalent to the number of audio engineers, equalization curves, music genres, music types, etc. In this manner, each "n" locations are associated with a different, respective variant of music (e.g., Rock, Country, etc.). As such, the user input identifies a selected variant, and the input feature set generator 210 may generate the one-hot matrix with a logic high (e.g., a one) in the corresponding "nth" location of the matrix. For example, if the user input 201 indicates that a user prefers to listen to music associated with the genre "Rock" (e.g., the user input indicates a preferred variant of "Rock" music), corresponding equalization curves generated by audio engineers known to listen to mainly "Rock" may be tagged and weighted in the one-hot matrix. Further in such an example, if there are ten audio engineers and the first and third audio engineers are known to listen to mainly "Rock," then a one-hot matrix may be generated to assign a higher weight to the equalization curves associated with the first and third audio engineers (e.g., [1, 0, 1, 0, 0, 0, 0, 0, 0, 0], [0.5, 0, 0.47, 0, 0, 0, 0, 0, 0, 0], etc.). Such a one-hot matrix is included in the EQ input feature set 205. In other examples disclosed herein, the matrix, or one-hot matrix, may be implemented using any suitable data structure such as, for example, a tree graph, an array, a string, etc.

In some examples, the input feature set generator 210 generates the EQ input feature set 205 including the one-hot matrix generated in response to the user input 201. Further, the input feature set generator 210 may generate the EQ input feature set 205 including average volume measurements for the frequency bins of a frequency representation of the incoming audio signal 203 throughout the buffer period and/or average standard deviation measurements for frequency bins of the frequency representation of the incoming audio signal 203 throughout the buffer period. In some examples, the input feature set generator 210 may include any available metadata in the set that is delivered to the equalization network generator 112 to assist the equalization network generator 112 in determining the appropriate equalization settings to be utilized for the incoming audio signal 203. In examples disclosed herein, the input feature set generator 210 may be an example means for generating.

In the illustrated example of FIG. 2, the model executor 212 is implemented by one or more circuits to execute the neural network model to identify optimal EQ adjustments (e.g., audio gains/cuts). The model executor 212 is configured to obtain (e.g., download, etc.), the trained neural network model (e.g., the trained neural network model 116) from the equalization network generator 112. Once the trained neural network model 116 is obtained, the model executor 212 uses the trained neural network model 116 with the one-hot matrix (e.g., the one-hot matrix generated by the input feature set generator 210), to determine example EQ adjustments 209.

In an example inference and/or otherwise operational phase, the model executor 212 further obtains and/or otherwise parses the EQ input feature set 205 to identify the one-hot matrix. The model executor 212 further parses the one-hot matrix to identify the variant selected in the user input 201. Once identified, the model executor 212 adjusts weights in the neural network model 114 corresponding to the user input 201. For example, the user input 201 may be identified in (e.g., translated to) a one-hot matrix (e.g., a 1×n matrix in which the variable "n" is equivalent to the number of audio engineers, equalization curves, music genres, music types, etc.). In this manner, the user input 201 identifies a corresponding logic high (e.g., a one) for each of the "n" equalization curves trained in the neural network model 114. As such, the model executor 212 adjusts the weights of the corresponding equalization curves, audio engineers, music genres, music types, etc. in the trained neural network model 116 corresponding to the one-hot matrix. For example, the model executor 212 identifies each of the "nth" elements in the one-hot matrix being a logic high and, thus, adjusts the weights of the corresponding "nth" equalization curves, audio engineers, music genres, music types, etc. in the trained neural network model 116. In this manner, the model executor 212 utilizes a single neural network model (e.g., the trained neural network model 116), while adjusting the weights corresponding to the user input 201. In examples disclosed herein, the model executor 212 may be an example means for executing.

Once the weights of the corresponding equalization curves, audio engineers, music genres, music types, etc., are adjusted based on the user input 201, the model executor 212 executes the trained neural network model 116. The model executor 212 determines whether execution of the trained neural network model 116 is successful. If the execution of the trained neural network model 116 is successful, the model executor 212 further generates example EQ adjustments 209. In examples disclosed herein, the EQ adjustments 209 are transmitted to the EQ curve manager 214. In some examples, the EQ adjustments 209 (e.g., audio gain and/or cuts) include a plurality of volume adjustment values (e.g., gains/cuts) corresponding to a plurality of frequency ranges. For example, the EQ adjustments 209 (e.g., audio gain and/or cuts) output by the EQ neural network can include a number of gain or cut values (e.g., twenty-four gain and/or cut values) corresponding to the same number of critical bands of hearing (e.g., twenty-four critical bands of hearing).

The example EQ curve manager 214 of the illustrated example of FIG. 2 determines equalization curves to be utilized to equalize the incoming audio signal 203 based on example EQ adjustments 209 (e.g., audio gain and/or cuts). The EQ curve manager 214 receives the EQ adjustments 209 (e.g., audio gain and/or cuts) and makes volume adjustments at frequency ranges of the average representation of the incoming audio signal 203. In some examples, the EQ curve manager 214 receives the EQ adjustments 209 (e.g., audio gain and/or cuts) as a plurality of values (e.g., scalars) to be applied at specific frequency ranges of the audio signal. In other examples, these values can be log-based gains and cuts (e.g., in decibels). In some such examples, the EQ adjustments 209 (e.g., audio gain and/or cuts) correspond to a plurality of log-spaced frequency bins. For example, the EQ gains/cuts may correspond to a number of critical bands used in a Bark Band representation (e.g., twenty-four critical bands of hearing).

In some examples, to apply the EQ adjustments 209 (e.g., audio gain and/or cuts) to the buffered portion of the incoming audio signal 203, the EQ curve manager 214 converts the linearly-spaced frequency representation of the incoming audio signal 203 (e.g., as generated by the time to frequency domain converter 208) to a log-spaced frequency representation of the incoming audio signal 203. In some such examples, the EQ curve manager 214 can add the EQ adjustments 209 (e.g., audio gain and/or cuts) in decibels to the volume levels in the log-spaced frequency representation to generate an equalized log-spaced frequency version of the buffered portion of the incoming audio signal 203. In some examples, the EQ adjustments 209 (e.g., audio gain and/or cuts) may be provided in a linear-spaced frequency representation and/or other representation, and applied to a common (i.e., linear-spaced) representation of the buffered portion of the incoming audio signal 203.

The example thresholding controller 215 of the illustrated example of FIG. 2 performs techniques to smooth out the equalized version of the buffered portion of the incoming audio signal 203. In some examples, after the EQ curve manager 214 applies the EQ adjustments 209 to the buffered portion of the incoming audio signal 203, a frequency representation of the equalized audio signal may have localized outliers (e.g., irregularities appearing as or short-term peaks or dips on a frequency-volume plot of the equalized audio signal) that may result in perceptible artifacts in the equalized audio signal. As utilized herein, the term localized outlier refers to an irregularity on a frequency-volume plot of an equalized audio signal, such as a large difference in volume between adjacent frequency values. In some examples, localized outliers are detected by determining whether the second derivative of volume over a frequency range exceeds a threshold.

The thresholding controller 215 of the illustrated example of FIG. 2 selects a plurality of frequency values at which to initiate the thresholding technique. The thresholding controller 215 determines volume levels at the plurality of frequency values, and then calculates a measure of the difference between these frequency values. In some examples, the thresholding controller 215 calculates the second derivative of the volume values over the plurality of frequency values. As an example, if three frequency values are being analyzed to determine whether a central one of the three frequency values corresponds to a localized outlier (e.g., an irregularity), the following equation may be utilized to calculate the second derivative, where the array val[ ] includes the volume values, the index "i" corresponds to the frequency value index:

$$|(val[i-2]-(2(val[i-1])+val[i])|  \quad \text{Equation 1}$$

The thresholding controller 215 can compare the output of Equation 1 to a threshold. In some examples, if the output of Equation 1, or any other equation utilized to calculate the relative difference of volume at one of the frequency values to volumes at adjacent frequency values, satisfies a threshold (e.g., exceeds the threshold), a smoothing calculation may be utilized to remove the irregularity. In some examples, the thresholding controller 215 adjusts the volume level at a detected irregularity by changing the volume to a midpoint between volume levels at adjacent frequency values. In some examples, the thresholding controller 215 may utilize any other technique to change the volume at a detected localized outlier. For example, the thresholding controller 215 may set the volume at the detected localized outlier equal to the volume at an adjacent frequency value or some other value to attempt to remove the localized outlier.

In some examples, the thresholding controller 215 iteratively moves throughout frequency ranges of the equalized audio signal to identify any volume levels which represents irregularities. In some examples, the thresholding controller 215, after analyzing all of the frequency values/ranges of the equalized audio signal, may iterate throughout the equalized audio signal one or more additional times to determine whether any localized outliers remain after the first adjustment phase (e.g., after volume levels for the localized outliers detected were changed). In some examples, the thresholding controller 215 is a neural network and/or other artificial intelligence that has been trained for irregularity (e.g., anomaly) detection. In some such examples, the thresholding controller 215 may eliminate the irregularities in one adjustment, without additional iterations being necessary.

After the thresholding controller 215 has removed the localized outliers from the equalized frequency representation of the audio signal, or once another stopping condition has been reached (e.g., performing ten iterations of localized outlier detection and adjustment throughout the entire frequency range), the thresholding controller 215 can communicate the final equalized representation of the incoming audio signal 203 to the EQ curve manager 214 so that the EQ curve manager 214 can determine an equalization curve to apply to the incoming audio signal. In examples disclosed herein, the thresholding controller 215 may be an example means for smoothing.

In some examples, the EQ curve manager 214 of the illustrated example of FIG. 2 subtracts the original average log-spaced frequency representation of the buffered portion of the incoming audio signal 203 from the equalized version to determine the final equalization curve to utilize for equalization. In some such examples, after this subtraction, the EQ curve manager 214 converts the final equalization curve to a form that can be applied to the frequency-domain representation of the buffered audio signal (e.g., a linear-spaced form). In some such examples, the EQ curve manager 214 of the illustrated example then applies the final EQ curve (e.g., the linear-spaced frequency representation of the final EQ curve) to the corresponding representation (e.g., the linear-spaced frequency representation of the buffered audio signal). The EQ curve manager 214 may communicate the resulting equalized audio signal to the volume normalizer 216, and/or the frequency to time domain converter 218. As used herein, an EQ curve includes gains, cuts and/or other volume adjustments corresponding to frequency ranges of an audio signal. In examples disclosed herein, the EQ curve manager 216 may be an example means for equalization managing.

The example volume normalizer 216 of the illustrated example of FIG. 2 accesses an indication of the change in energy levels before and after equalization of the incoming audio signal 203. The volume normalizer 216 of the illustrated example of FIG. 2 performs volume normalization to account for the overall change of the audio signal before and after equalization. In some examples, if the change in energy level before and after the equalization of the incoming audio signal 203 exceeds a threshold, the volume normalizer 216 applies a scalar volume adjustment to account for the change in energy level. In some examples, the volume normalizer 216 may utilize a dynamic range compressor. In some examples, the volume normalizer 216 can utilize a ratio of the energy before and after the equalization process to cancel out any change in overall volume. For example, if the overall energy of the audio signal doubled, the volume normalizer 216 can apply an overall volume cut to reduce the volume by one-half. In some examples, the volume normalizer 216 may determine that the change in energy is insufficient to justify a volume normalization. The volume normalizer 216 of the illustrated example communicates the final (volume adjusted, if applicable) equalized audio signal to the frequency to time domain converter 218. In examples disclosed herein, the volume normalizer 216 may be an example means for normalizing.

The frequency to time domain converter 218 of the illustrated example of FIG. 2 converts the final equalized audio signal from the frequency domain to the time domain to generate an example equalized audio signal 211. In examples disclosed herein, the equalized audio signal 211 is output from the media unit 106 of FIG. 1. In examples disclosed herein, the frequency to time converter 218 may be an example means for time converting.

While numerous techniques are discussed throughout this description with respect to utilizing a linear-spaced frequency representation, a log-spaced frequency representation, a time-domain representation, or other representations of the incoming audio signal 203, any combination of these representations or others may be utilized at any of the described steps throughout the equalization process.

While an example manner of implementing the media unit 106 of FIG. 1 is illustrated in FIG. 2, one or more of the elements, processes and/or devices illustrated in FIG. 2 may be combined, divided, re-arranged, omitted, eliminated and/or implemented in any other way. Further, the example user interface 202, the example buffer manager 204, the example first datastore 206, the example second datastore 207, the example time to frequency domain converter 208, the example input feature set generator 210, the example EQ curve manager 214, the thresholding controller 215, the example volume normalizer 216, the example frequency to time domain converter 218 and/or, more generally, the example media unit 106 of FIG. 2 may be implemented by hardware, software, firmware and/or any combination of hardware, software and/or firmware. Thus, for example, any of the example user interface 202, the example buffer manager 204, the example first datastore 206, the example second datastore 207, the example time to frequency domain converter 208, the example input feature set generator 210, the example EQ curve manager 214, the thresholding controller 215, the example volume normalizer 216, the example frequency to time domain converter 218 and/or, more generally, the example media unit 106 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example user interface 202, the example buffer manager 204, the example first datastore 206, the example second datastore 207, the example time to frequency domain converter 208, the example input feature set generator 210, the example EQ curve manager 214, the thresholding controller 215, the example volume normalizer 216, and/or the example frequency to time domain converter 218 is/are hereby expressly defined to include a non-transitory computer readable storage device or storage disk such as a memory, a digital versatile disk (DVD), a compact disk (CD), a Blu-ray disk, etc. including the software and/or firmware. Further still, the example media unit 106 of FIG. 2 may include one or more elements, processes and/or devices in addition to, or instead of, those illustrated in FIG. 2, and/or may include more than one of any or all of the illustrated elements, processes and devices. As used herein, the phrase "in communication, including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
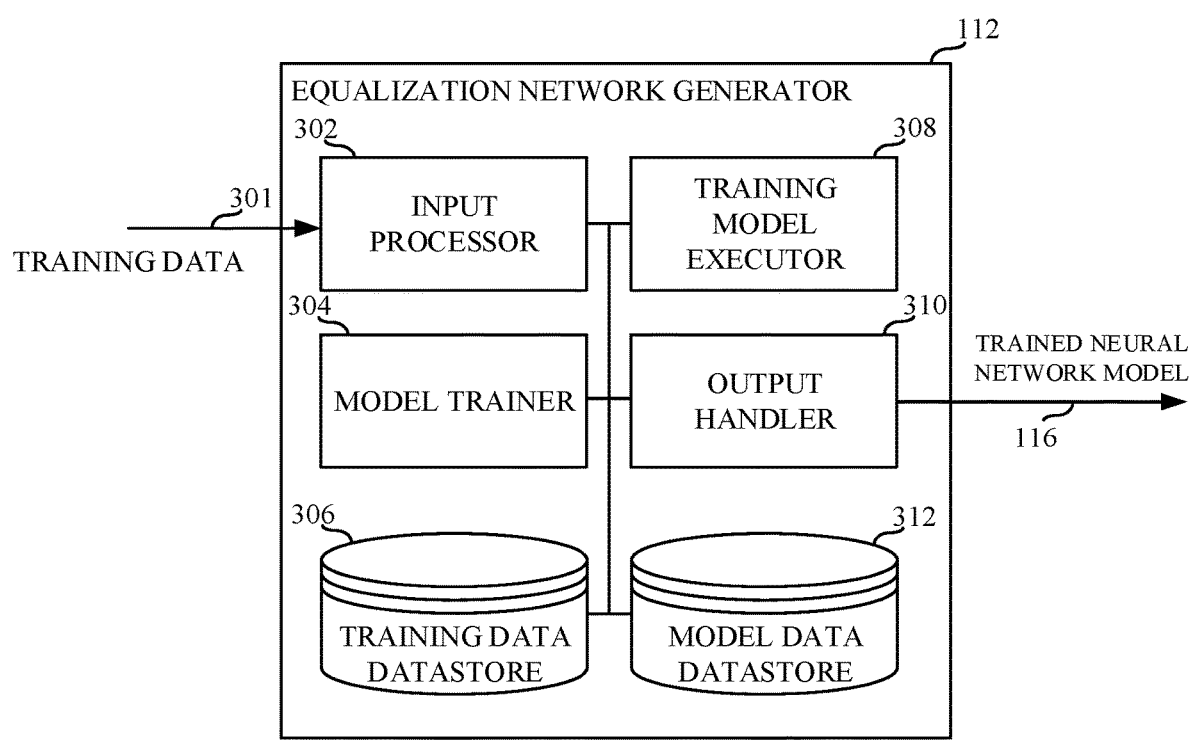
FIG. 3 is a block diagram of the example equalization network generator of FIG. 1 capable of training the neural network model for use by the media unit of FIGS. 1 and 2.

FIG. 3 is a block diagram of the example equalization network generator 112 of FIG. 1 capable of training the neural network model 114 for use by the media unit 106 of FIGS. 1 and 2. The example equalization network generator 112 includes an example input processor 302, an example model trainer 304, an example training data datastore 306, an example training model executor 308, an example output handler 310, and an example model data datastore 312.

In the example of FIG. 3, the input processor 302 can be implemented by one or more circuits. The example input processor 302 is configured to obtain example training data 301. In examples disclosed herein, the training data 301 includes a plurality of reference audio signals and a plurality of equalization curves generated by audio engineers associated with a respective variant of music (e.g., a specific music genre or type of music). In examples disclosed herein, the training data 301 is organized by variant of music. For example, if a number of reference audio signals (e.g., ten) is obtained, each of the ten reference audio signals associated with a number of equalization curves generated by a number of audio engineers (e.g., ten), then the input processor 301 can separate the input data 301 into a number of elements (e.g., ten). In this manner, the example input processor 302 can store the organized training data 301 in the training data datastore 306. While the trained model (e.g., the neural network model 114) is obtained for execution by the media unit 106, in some examples disclosed herein, during an example inference and/or otherwise operational phase, the input processor 302 may obtains the example EQ input feature set 205 from the media unit 106. In such an example, the input processor 302 may transmit data corresponding to the EQ input feature set 205 to the training model executor 308. In examples disclosed herein, the input processor 302 may be an example means for processing.

In examples disclosed herein, the trained model (e.g., the trained neural network model 116) is exported for direct use on the media unit 106, while in other examples disclosed herein, a trained model from model trainer 304 resides on the equalization network generator 112. Machine learning techniques, whether deep learning networks or other experiential/observational learning system, can be used to optimize results, locate an object in an image, understand speech and convert speech into text, and improve the relevance of search engine results, for example. While many machine learning systems are seeded with initial features and/or network weights to be modified through learning and updating of the machine learning network, a deep learning network trains itself to identify "good" features for analysis. Using a multilayered architecture, machines employing deep learning techniques can process raw data better than machines using conventional machine learning techniques. Examining data for groups of highly correlated values or distinctive themes is facilitated using different layers of evaluation or abstraction.

An example deep learning neural network can be trained on a set of expert classified data, for example. This set of data builds the first parameters for the neural network, and this would be the stage of supervised learning. During supervised learning, the neural network can be tested to determine whether the desired behavior has been achieved.

In the example of FIG. 3, the model trainer 304 can be implemented by one or more circuits to update and/or otherwise validate the neural network model 114 of FIG. 1. The model trainer 304 can train the neural network model 114 (e.g., a single neural network model) via a suitable supervised or unsupervised training method. The example model trainer 304 can train the neural network model 114 in an iterative approach by training the neural network model 114 until the model performs to (e.g., satisfies) a desired training threshold (e.g., a desired accuracy threshold of 95%) of training data (e.g., the training data 301). In examples disclosed herein, the desired training threshold is a desired accuracy percentage corresponding to the accuracy of the model (e.g., the neural network model 114 after an initial execution) based on the training data 301. The model trainer 304 adjusts the weights of the corresponding equalization curves, audio engineers, music genres, music types, etc. based on an output from the training model executor 308. For example, the model trainer 304 updates each weight of the organized training data entries (e.g., a first entry being associated with "Rock" music, a second entry being associated with "Country" music, etc.), based on the output of the training model executor 308. In this manner, the model trainer 304 utilizes a single neural network model (e.g., the neural network model 114), while adjusting the weights corresponding to the training data 301. In examples disclosed herein, the model trainer 304 may be an example means for training.

If the neural network model 114 performs below (e.g., does not satisfy) the desired training threshold, the example model trainer 304 updates weights associated with the model based on the result of the comparison with a desired training threshold. Additionally or alternatively, the example model trainer 304 can determine whether to retrain the model. For example, if new training data is received and/or if a training entity (e.g., administrator, controller, etc.) determines that a threshold period of time has passed without training the model, the model trainer 304 can retrain the model.

Specifically, the model trainer 304 of the illustrated example can train the neural network model 114 using a library of reference audio signals (e.g., training data 301) for which audio equalization profiles (e.g., gains, cuts, etc.) have been determined (e.g., by an audio engineer). In the illustrated example of FIG. 3, the model trainer 304 receives the training data 301. The received and/or otherwise obtained training data 301 may include engineer tags that indicate, for specific tracks, which one of a plurality of audio engineers generated the equalization profile for the track. In some examples, without informing the model trainer 304 of the engineer that generated the equalization profile for a track, the model trainer 304 may ultimately average the relative stylistic differences between different audio engineers. For example, if a first set of reference audio signals has EQ curves generated by an audio engineer that generally emphasizes the bass frequency range more, while a second set of reference audio signals has EQ curves generated by an audio engineer that generally emphasizes the middle frequency range more, the model trainer 304 may cancel these relative difference during training if it is unaware which audio engineer generated the EQ curves. By providing the engineer tags associated with the ones of the plurality of reference audio signals and corresponding EQ curves, the model trainer 304 intelligently learns to recognize different equalization styles. In some examples, the model trainer 304 is trained by associating samples of ones of the reference audio signals with the known EQ curves for the reference audio signals.

In some examples, reference audio signals can be generated by taking professionally engineered tracks and deteriorating the audio by applying equalization curves to target a match with a spectral envelope of track that is not professionally engineered (e.g., from a lesser known artist). The model trainer 304 can then be trained to revert the deterioration by applying equalization curves to restore the track to its original quality level. Thus, any professionally engineered track can be utilized with this deterioration technique to enable high volume training.

In some examples, a loss function can be utilized for training by the model trainer 304. For example, Equation 2, represents one example loss function that can be utilized, where gi is the ground truth gain value in frequency bin "i," and ĝi is the predicted value for that bin:

$$L = \sum_{i=1}^{25} (g_i - \hat{g}_i)^2 \qquad \text{Equation 2}$$

Once a desired neural network behavior has been achieved (e.g., a machine has been trained to operate according to a desired training threshold, etc.), the neural network model 114 model can be deployed for use (e.g., testing the neural network model 114 with "real" data, etc.). In some examples, the neural network can then be used without further modifications or updates to the neural network parameters (e.g., weights). An example flowchart representative of machine readable instructions for training the neural network model 114 is illustrated and described in connection with FIG. 7.

In the example of FIG. 3, the training data datastore 306 is memory. The example training data datastore 306 is configured to store the training data 301. In some examples disclosed herein, the training data datastore 306 may be configured to store the training data 301 in a cloud environment. Alternatively, the training data datastore 306 may be configured to store the training data 301 in a remote and/or local datacenter and/or any location.

The example training data datastore 306 may be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory). The example training data datastore 306 may additionally or alternatively be implemented by one or more double data rate (DDR) memories, such as DDR, DDR2, DDR3, DDR4, mobile DDR (mDDR), etc. The example training data datastore 306 may additionally or alternatively be implemented by one or more mass storage devices such as hard disk drive(s), compact disk drive(s), digital versatile disk drive(s), solid-state disk drive(s), etc. While in the illustrated example the training data datastore 306 is illustrated as a single database, the training data datastore 306 may be implemented by any number and/or type(s) of databases. Furthermore, the data stored at the example training data datastore 306 may be in any data format such as, for example, binary data, comma delimited data, tab delimited data, structured query language (SQL) structures, etc. In FIG. 3, the example training data datastore 306 is an organized collection of data, stored on a computational system that is electronically accessible. For example, the training data datastore 306 may be stored on a server, a desktop computer, an HDD, an SSD, or any other suitable computing system. In examples disclosed herein, the training data datastore 306 may be an example means for storing training data.

In the illustrated example of FIG. 3, the training model executor 308 can be implemented by one or more circuits to execute the neural network model to identify optimal EQ adjustments (e.g., audio gains/cuts). The training model executor 308 executes the neural network model 114 based on the training data 301. In this manner, the training model executor 308 executes the neural network model 114 to identify a trained neural network model (e.g., the trained neural network model 116 obtained by the media unit 106) based on the training data 301. In examples disclosed herein, the trained neural network model (e.g., the trained neural network model 116 obtained by the media unit 106) is transmitted to the model trainer 304. In examples disclosed herein, the training model executor 308 may be an example means for training model executing.

In the illustrated example of FIG. 3, the output handler 310 can be implemented by one or more circuits to dispatch the trained neural network model (e.g., the trained neural network model 116 obtained by the media unit 106). For example, the output handler 310 can dispatch the trained neural network model 116 to the media unit 106. In additional or alternative examples, the output handler 310 can dispatch trained models to the model data datastore 312. In examples disclosed herein, the output handler 310 may be an example means for handling.

In the example illustrated in FIG. 3, the model data datastore 312 is memory. The example model data datastore 312 is configured to store the model trained by the model trainer 304 and/or the training model executor 308. In some examples disclosed herein, the model data datastore 312 may be configured to store EQ adjustments 209 generated by the training model executor 308. Alternatively, the model data datastore 312 may be configured to store the data (e.g., the neural network model 114, the EQ adjustments 209, etc.) in a remote and/or local datacenter and/or any location.

The example model data datastore 312 may be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory). The example model data datastore 312 may additionally or alternatively be implemented by one or more double data rate (DDR) memories, such as DDR, DDR2, DDR3, DDR4, mobile DDR (mDDR), etc. The example model data datastore 312 may additionally or alternatively be implemented by one or more mass storage devices such as hard disk drive(s), compact disk drive(s), digital versatile disk drive(s), solid-state disk drive(s), etc. While in the illustrated example the model data datastore 312 is illustrated as a single database, the model data datastore 312 may be implemented by any number and/or type(s) of databases. Furthermore, the data stored at the example model data datastore 312 may be in any data format such as, for example, binary data, comma delimited data, tab delimited data, structured query language (SQL) structures, etc. In FIG. 3, the example model data datastore 312 is an organized collection of data stored on a computational system that is electronically accessible. For example, the model data datastore 312 may be stored on a server, a desktop computer, an HDD, an SSD, or any other suitable computing system. In examples disclosed herein, the model data datastore 312 may be an example means for storing models.

In some examples, a level of accuracy of the model generated by the model trainer 304 can be determined by the training model executor 308. In such examples, the training model executor 308 receives a set of audio playback settings training data. The model trainer 304 of the illustrated example of FIG. 3 determines an effectiveness of the EQ adjustments 209 (e.g., audio gain and/or cuts) output by the output handler 310 in response to an input feature set. In some examples, the model trainer 304 may determine how closely an output of the equalization network generator 112 corresponds to a known EQ curve for the input feature set. For example, the EQ input feature set 205 can be an audio sample for which an audio engineer has provided an EQ curve, and the model trainer 304 can compare the EQ adjustments 209 (e.g., audio gain and/or cuts) output by output handler 310 with the EQ curve (e.g., gains/cuts) provided by the audio engineer.

In examples disclosed herein, each of the input processor 302, the model trainer 304, the training data datastore 306 the training model executor 308, the output handler 310, and/or the model data datastore 312 is in communication with the other elements of the media unit 106. In examples disclosed herein, the input processor 302, the model trainer 304, the training data datastore 306 the training model executor 308, the output handler 310, and/or the model data datastore 312 may be in communication via any suitable wired and/or wireless communication system. Additionally, in examples disclosed herein, each of the input processor 302, the model trainer 304, the training data datastore 306 the training model executor 308, the output handler 310, and/or the model data datastore 312 may be in communication with any component exterior to the media unit 106 via any suitable wired and/or wireless communication system.

While an example manner of implementing the equalization network generator 112 is illustrated in FIG. 3, one or more of the elements, processes and/or devices illustrated in FIG. 3 may be combined, divided, re-arranged, omitted, eliminated and/or implemented in any other way. Further, the example input processor 302, the example model trainer 304, the example training data datastore 306, the example training model executor 308, the example output handler 310, the example model data datastore 312, and/or, more generally, the example equalization network generator 112 of FIG. 3 may be implemented by hardware, software, firmware and/or any combination of hardware, software and/or firmware. Thus, for example, any of the example input processor 302, the example model trainer 304, the example training data datastore 306, the example training model executor 308, the example output handler 310, the example model data datastore 312, and/or, more generally, the example equalization network generator 112 of FIG. 3 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example input processor 302, the example model trainer 304, the example training data datastore 306, the example training model executor 308, the example output handler 310, and/or the example model data datastore 312 is/are hereby expressly defined to include a non-transitory computer readable storage device or storage disk such as a memory, a digital versatile disk (DVD), a compact disk (CD), a Blu-ray disk, etc. including the software and/or firmware. Further still, equalization network generator 112 of FIG. 3 may include one or more elements, processes and/or devices in addition to, or instead of, those illustrated in FIG. 3, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4:
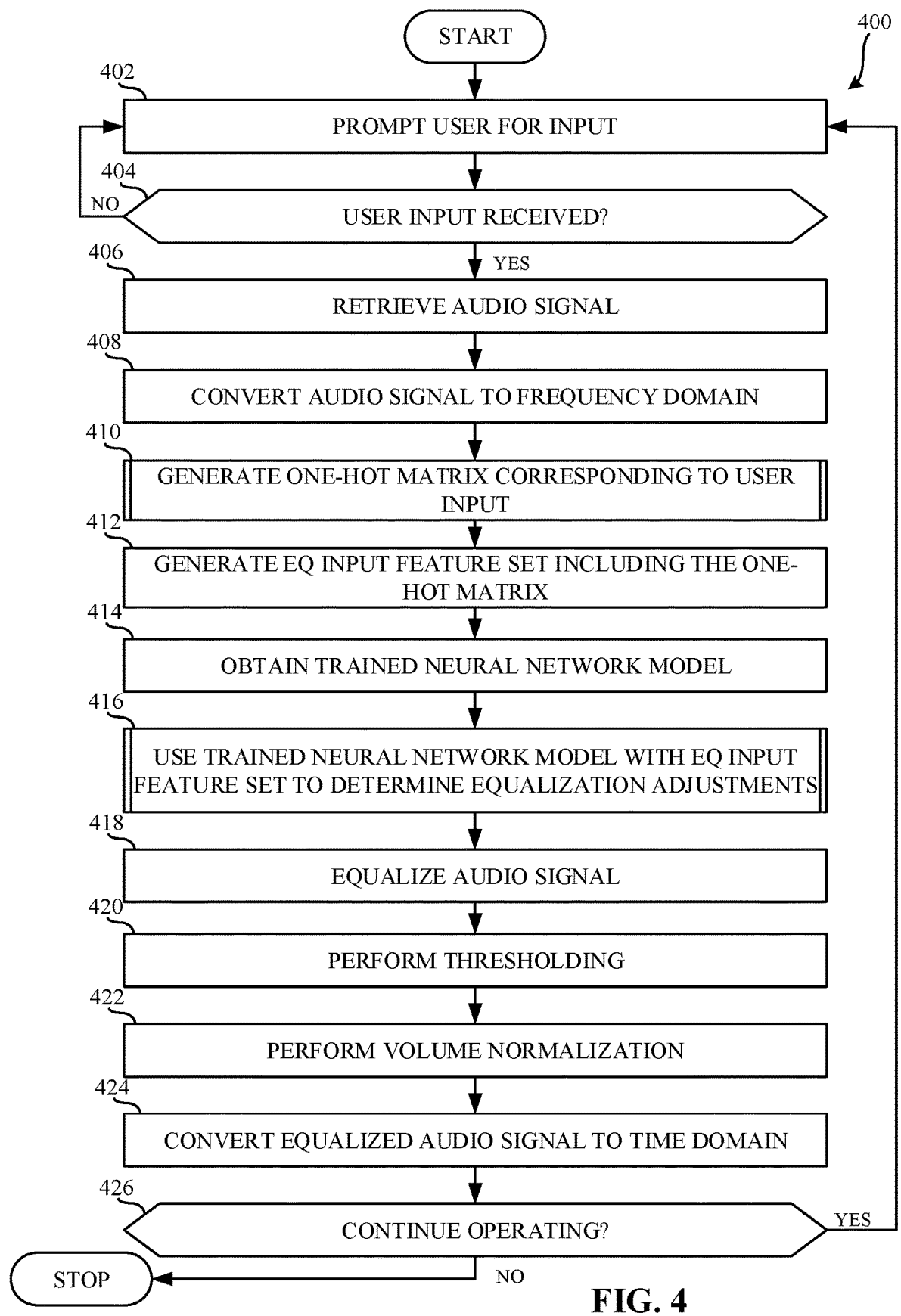
FIG. 4 is a flowchart representative of example machine readable instructions which may be executed to implement the media unit of FIGS. 1 and/or 2.
Figure 5:
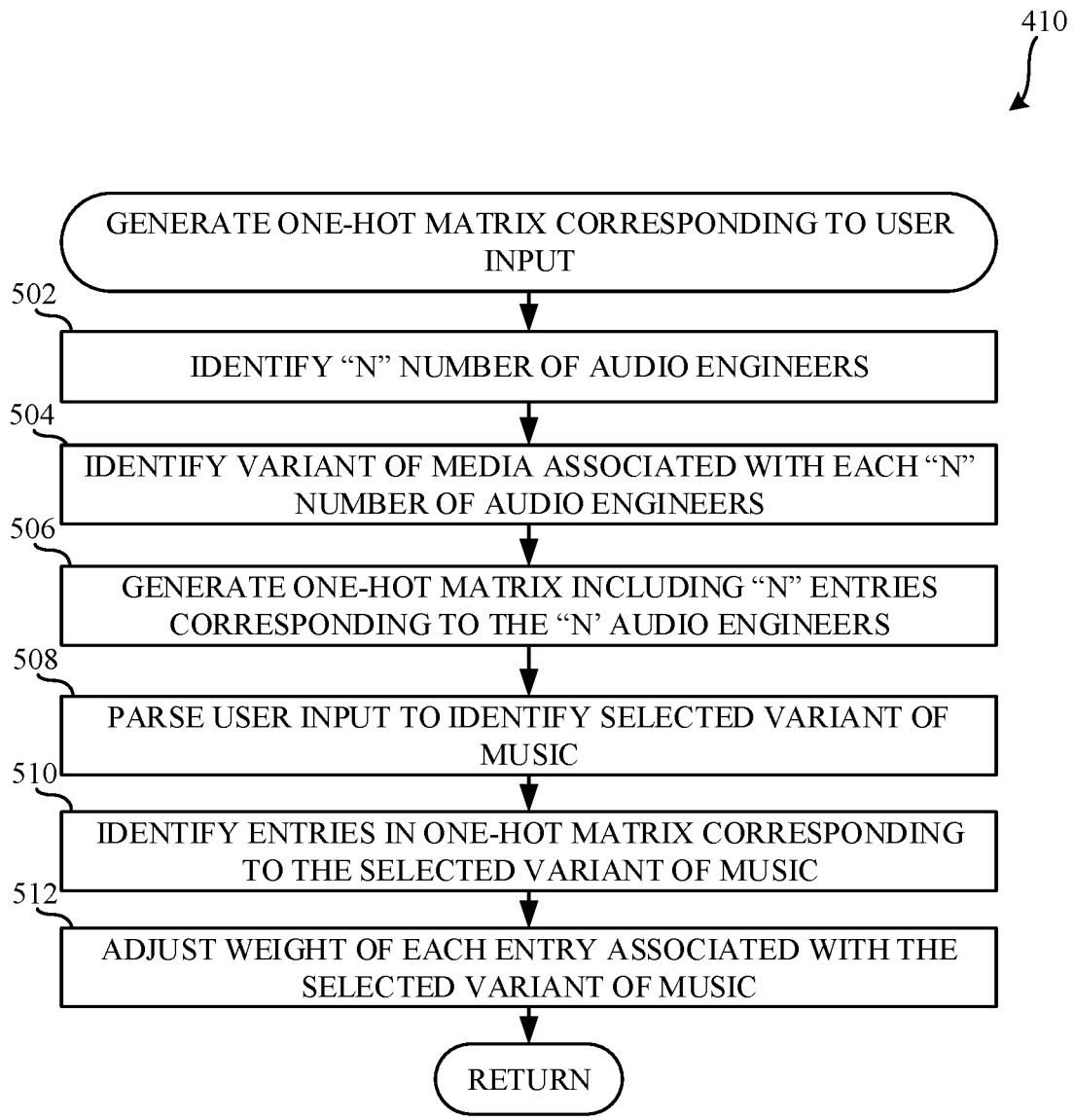
FIG. 5 is a flowchart representative of example machine readable instructions which may be executed to implement the input feature set generator of FIG. 2 to generate a one-hot matrix corresponding to the user input of FIG. 2.

Flowcharts representative of example hardware logic, machine readable instructions, hardware implemented state machines, and/or any combination thereof for implementing the media unit 106 of FIGS. 1 and/or 2 are shown in FIGS. 4, 5, and/or 6. The machine readable instructions may be one or more executable programs or portion(s) of an executable program for execution by a computer processor such as the processor 812 shown in the example processor platform 800 discussed below in connection with FIG. 8. The program may be embodied in software stored on a non-transitory computer readable storage medium such as a CD-ROM, a floppy disk, a hard drive, a DVD, a Blu-ray disk, or a memory associated with the processor 812, but the entire program and/or parts thereof could alternatively be executed by a device other than the processor 812 and/or embodied in firmware or dedicated hardware. Further, although the example program is described with reference to the flowcharts illustrated in FIGS. 4, 5, and/or 6, many other methods of implementing the example media unit 106 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 4, 5, and/or 6 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 4 is a flowchart representative of example machine readable instructions 400 which may be executed to implement the media unit 106 of FIGS. 1 and/or 2. With reference to the preceding figures and associated description, the example machine readable instructions 400 begin with the example user interface 202 prompting the user for an input. (Block 402). Moreover, the user interface 202 determines whether example user input 201 is received. (Block 404). If the user interface 202 determines that the example user input 201 is not received (e.g., the control of block 404 returns a result of NO), then control returns to block 402. In other examples disclosed herein, if the user interface 202 determines that the example user input 201 is not received (e.g., the control of block 404 returns a result of NO), control may alternatively proceed to block 424.

Alternatively, if the user interface 202 determines the user input 201 is received (e.g., the control of block 404 returns a result of YES), then the media unit 106 retrieves the incoming audio signal 203. (Block 406). In some examples, the example buffer manager 204 retrieves the incoming audio signal 203 and stores a first portion of the incoming audio signal in the first datastore 206 and a second portion of the incoming audio signal the second datastore 207. In some examples, the buffer manager 204 removes portions of the incoming audio signal 203 which have exceeded their storage duration in the buffer (e.g., ten seconds, thirty seconds, etc.). At block 408, the time to frequency domain converter 208 converts the audio signal 203 to the frequency domain. (Block 408). For example, the time to frequency domain converter 208 may perform a frequency transform (e.g., an FFT) on the incoming audio signal 203, or a portion of the incoming audio signal 203, in the first datastore 206 or the second datastore 207.

The input feature set generator 210 generates a one-hot matrix corresponding to the user input 201. (Block 410). A detailed description of the instructions illustrated in block 410 is explained in further detail below, in connection with FIG. 5. Additionally, the input feature set generator 210 generates an EQ input feature set 205 including the one-hot matrix. (Block 412). In some examples disclosed herein, the EQ input feature set 205 may also include average volume measurements for the frequency bins of a frequency representation of the incoming audio signal 203 throughout the buffer period and/or average standard deviation measurements for frequency bins of the frequency representation of the incoming audio signal 203 throughout the buffer period.

In response to, or in parallel with the control executed in any of blocks 402, 404, 406, 408, 410, or 412 the model executor 212 obtains the trained neural network model (e.g., the trained neural network model 116). (Block 414). For example, the model executor 212 may communicate with the equalization network generator 112 (FIG. 1) to retrieve the trained neural network model. In some examples disclosed herein, the model executor 212 may already have a version of the trained neural network model 116 stored and, as such, need not obtain the trained neural network model 116 from a database. For example, the model executor 212 may obtain the trained neural network model 116 from an internal library in the media unit 106. In such an example, the trained neural network model 116 may be delivered to the media unit 106 via a deliverable library.

At block 416, the model executor 212 uses the trained neural network model 116 with the one-hot matrix (e.g., the one-hot matrix generated by the input feature set generator 210), to determine example EQ adjustments 209. (Block 416). A detailed description of the instructions illustrated in block 416 is explained in further detail below, in connection with FIG. 6.

In response, the EQ curve manager 214 equalizes the audio signal 203. (Block 418). For example, the EQ curve manager 214 may determine equalization curves based on the EQ adjustments 209 (e.g., audio gain and/or cuts) by making volume adjustments, etc. Once the audio signal 203 is equalized, the thresholding controller 215 performs thresholding. (Block 420). For example, the thresholding controller may perform thresholding techniques to smooth the frequency profile of the incoming audio signal responsive to the audio signal 203 being equalized. The volume normalizer 216 performs volume normalization to account for the overall change of the audio signal 203 before and after equalization. (Block 422). The frequency to time domain converter 218 converts the equalized audio signal from the frequency domain to the time domain to generate the example equalized audio signal 211. (Block 424). For example, the frequency to time domain converter 218 may perform an inverse frequency transform (e.g., an inverse FFT) to convert the equalized audio signal to the time domain.

In examples disclosed herein, the media unit 106 determines whether to continue operating. (Block 426). When the media unit 106 determines to continue operating (e.g., the control of block 424 returns a result of YES), then control returns to block 402. In examples disclosed herein, the media unit 106 may determine to continue operating in response to a new user input requested, a song change, a time threshold exceeding, etc. Alternatively, when the media unit 106 determines not to continue operating (e.g., the control of block 426 returns a result of NO), then control stops. In examples disclosed herein, the media unit 106 may determine not to continue operating in response to a power off event, a stop signal being received, etc.

FIG. 5 is a flowchart representative of example machine readable instructions which may be executed to implement the input feature set generator 210 of FIG. 2 to generate a one-hot matrix corresponding to the user input 201 of FIG. 2. In the example illustrated in FIG. 5, the example input feature set generator 210 identifies "N" number of audio engineers. (Block 502). For example, the input feature set generator 210 may communicate with the equalization network generator 112 (FIG. 1) to identify the "N" number of audio engineers used in training the trained neural network model 116 (FIG. 1). In response to the control of block 502, the input feature set generator 210 identifies the variant of media associated with each "N" number of audio engineers. (Block 504). In this manner, the input feature set generator 210 generates a one-hot matrix including "N" entries corresponding to the "N" number of audio engineers. (Block 506).

Once the user input 201 (FIG. 1) is obtained, the input feature set generator 210 parses the user input to identify the selected variant of music. (Block 508). Accordingly, the input feature set generator 210 identifies a subset of the "N" entries in the one-hot matrix that are associated with a variant of music equivalent to, or substantially similar to, the selected variant of music. (Block 510). For example, if a user selects the variant of music "Rock," any of the "N" entries corresponding to "Rock," or substantially corresponding to "Rock," (e.g., Punk Rock, Religious Rock, etc.), are identified and/or otherwise determined by the input feature set generator 210.

The input feature set generator 210 then adjusts the weight of each of the subset of "N" entries associated with the variant of music. (Block 512). Such a resulting matrix is a one-hot matrix including "N" entries each weighted corresponding to the user input 201. After the input feature set generator 210 generates the one-hot matrix, the process returns to block 412 of FIG. 4.

Figure 6:
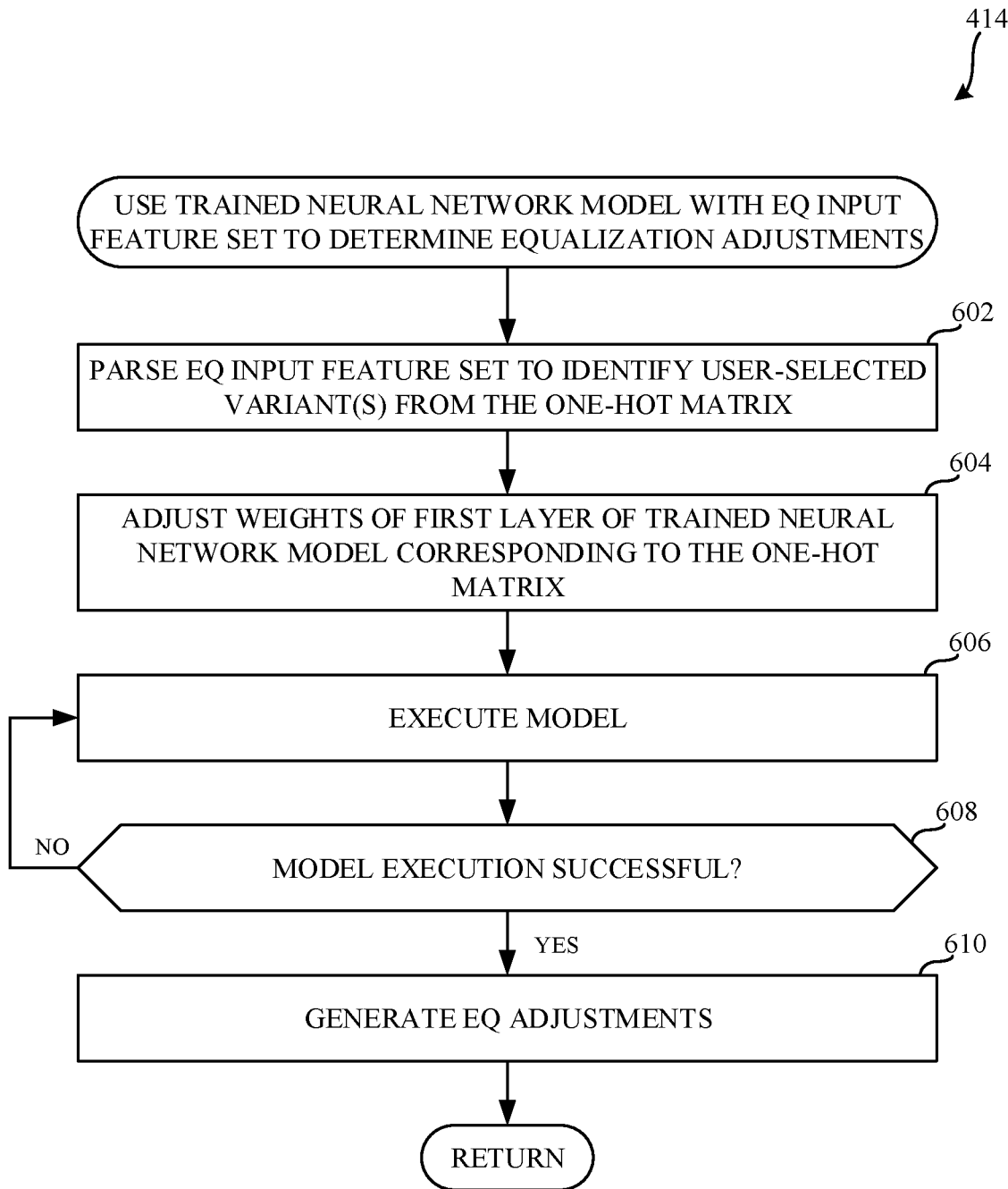
FIG. 6 is a flowchart representative of example machine readable instructions which may be executed to implement the model executor of FIG. 2 to determine example equalization adjustments.

FIG. 6 is a flowchart representative of example machine readable instructions which may be executed to implement the model executor 212 of FIG. 2 to determine example equalization adjustments 209. In the example illustrated in FIG. 6, the example model executor 212 parses the EQ input feature set 205 to identify the user-selected variant(s) from the one-hot matrix. (Block 602). In response, the model executor 212 adjusts the weights of a first layer of the trained neural network model 116 (e.g., adjusts the corresponding equalization curves, audio engineers, music genres, music types, etc.) corresponding to the one-hot matrix. (Block 604).

In response, the model executor 212 executes the trained neural network model 116 using the audio signal 203, or a portion of the audio signal 203, as an input. (Block 606). The model executor 212 determines whether execution of the trained neural network model 116 is successful. (Block 608). When the model executor 212 determines execution of the trained neural network model 116 is not successful (e.g., the control of block 608 returns a result of NO), control returns to block 606. Alternatively, when the model executor 212 determines execution of the trained neural network model 116 is successful (e.g., the control of block 608 returns a result of YES), then the model executor 212 generates example EQ adjustments 209. (Block 610). After the model executor 212 generates the EQ adjustments 209, the process returns to block 418 of FIG. 4.

Figure 7:
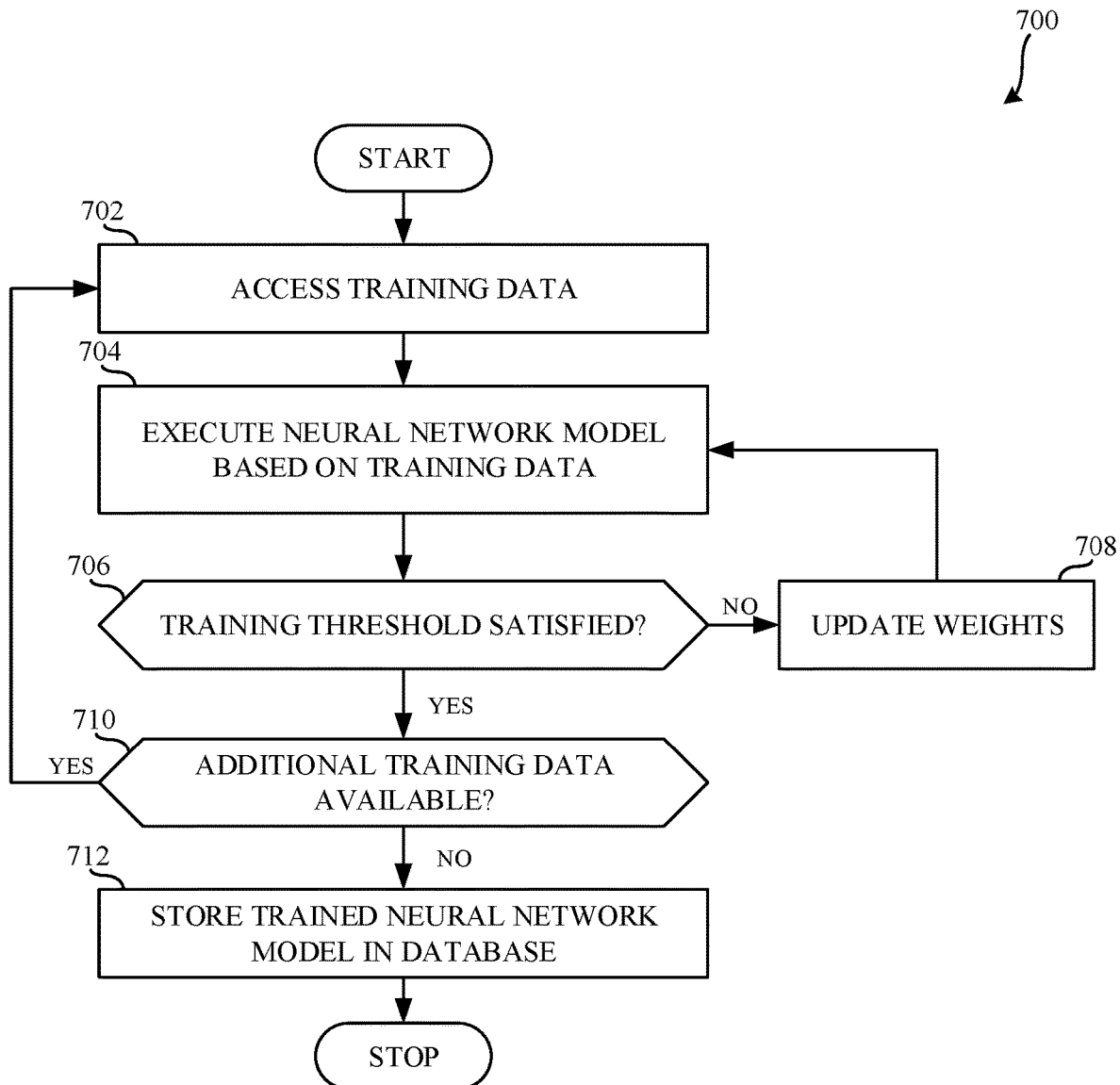
FIG. 7 is a flowchart representative of example machine readable instructions which may be executed to implement the equalization network generator of FIGS. 1 and/or 3 to train the neural network model.

A flowchart representative of example hardware logic, machine readable instructions, hardware implemented state machines, and/or any combination thereof for implementing the equalization network generator 112 of FIGS. 1 and/or 3 is shown in FIG. 7. The machine readable instructions may be one or more executable programs or portion(s) of an executable program for execution by a computer processor such as the processor 912 shown in the example processor platform 900 discussed below in connection with FIG. 9. The program may be embodied in software stored on a non-transitory computer readable storage medium such as a CD-ROM, a floppy disk, a hard drive, a DVD, a Blu-ray disk, or a memory associated with the processor 812, but the entire program and/or parts thereof could alternatively be executed by a device other than the processor 812 and/or embodied in firmware or dedicated hardware. Further, although the example program is described with reference to the flowchart illustrated in FIG. 7, many other methods of implementing the example equalization network generator 112 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

FIG. 7 is a flowchart representative of example machine readable instructions 700 which may be executed to implement the equalization network generator 112 of FIGS. 1 and/or 3 to train the neural network model 114. With reference to the preceding figures and associated description, the example machine readable instructions 700 begin with the example input processor 302 accessing the training data 301. (Block 702).

The example training model executor 308 executes the neural network model 114 based on the training data 301. (Block 704). In response, the model trainer 304 determines whether an associated training threshold is satisfied. (Block 706). In response to the model trainer 304 determining the associated training threshold is not satisfied (e.g., the control of block 706 returns a result of NO), then the model trainer 304 updates and/or otherwise adjusts the weights of the neural network model 114. (Block 708). After execution of the control illustrated in block 708, control returns to block 704.

Alternatively, in response to the model trainer 304 determining the training threshold is satisfied (e.g., the control of block 706 returns a result of YES), then the input processor 302 determines whether additional training data is available. (Block 710). For example, the model trainer 304 may determine additional training data is available if there is unanalyzed training data stored in the training data datastore 306, additional training data received, etc. In response to the model trainer 304 determining additional training data is available (e.g., the control of block 710 returns a result of YES), control returns to block 702.

Alternatively, in response to the model trainer 304 determining additional training data is not available (e.g., the control of block 710 returns a result of NO), then the model trainer 304 stores the trained neural network model 116 in the model data datastore 312. (Block 712).

Figure 8:
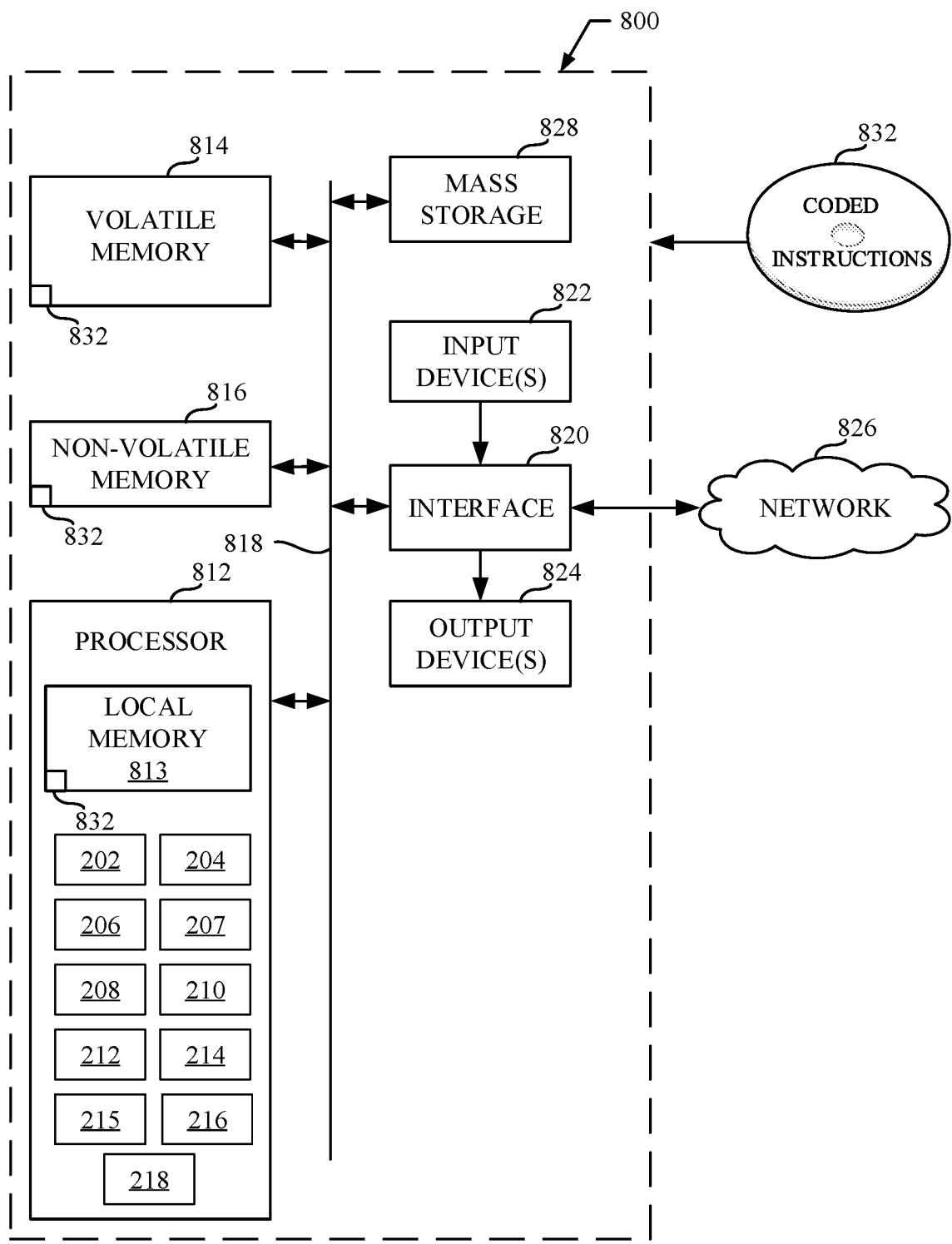
FIG. 8 is a block diagram of an example processor platform structured to execute the instructions of FIGS. 4, 5 and/or 6 to implement the media unit of FIGS. 1 and/or 2.

FIG. 8 is a block diagram of an example processor platform 800 structured to execute the instructions of FIGS. 4, 5, and/or 6 to implement the media unit 106 of FIGS. 1 and/or 2. The processor platform 800 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 800 of the illustrated example includes a processor 812. The processor 812 of the illustrated example is hardware. For example, the processor 812 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example user interface 202, the example buffer manager 204, the example first datastore 206, the example second datastore 207, the example time to frequency domain converter 208, the example input feature set generator 210, the example model executor 212, the example EQ curve manager 214, the thresholding controller 215, the example volume normalizer 216, and the example frequency to time domain converter 218. In some examples, one or more components of the media unit 106 may be implemented by a first processor, while one or more other components of the media unit 106 may be implemented by a second processor. For example, components corresponding to computing an equalization profile (e.g., the EQ curve manager 214, etc.) may be implemented by a separate processor than other components of the media unit 106 (e.g., the buffer manager 204, the frequency to time domain converter 218, etc.).

The processor 812 of the illustrated example includes a local memory 813 (e.g., a cache). The processor 812 of the illustrated example is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), a Bluetooth® interface, a near field communication (NFC) interface, and/or a PCI express interface.

In the illustrated example, one or more input devices 822 are connected to the interface circuit 820. The input device(s) 822 permit(s) a user to enter data and/or commands into the processor 812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 820 of the illustrated example, thus, typically includes a graphics driver card, a graphics driver chip and/or a graphics driver processor.

The interface circuit 820 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 826. The communication can be via, for example, an Ethernet connection, a digital subscriber line (DSL) connection, a telephone line connection, a coaxial cable system, a satellite system, a line-of-site wireless system, a cellular telephone system, etc.

The processor platform 800 of the illustrated example also includes one or more mass storage devices 828 for storing software and/or data. Examples of such mass storage devices 828 include floppy disk drives, hard drive disks, compact disk drives, Blu-ray disk drives, redundant array of independent disks (RAID) systems, and digital versatile disk (DVD) drives.

The machine executable instructions 832, 400 of FIGS. 4, 5, and/or 6 may be stored in the mass storage device 828, in the volatile memory 814, in the non-volatile memory 816, and/or on a removable non-transitory computer readable storage medium such as a CD or DVD.

Figure 9:
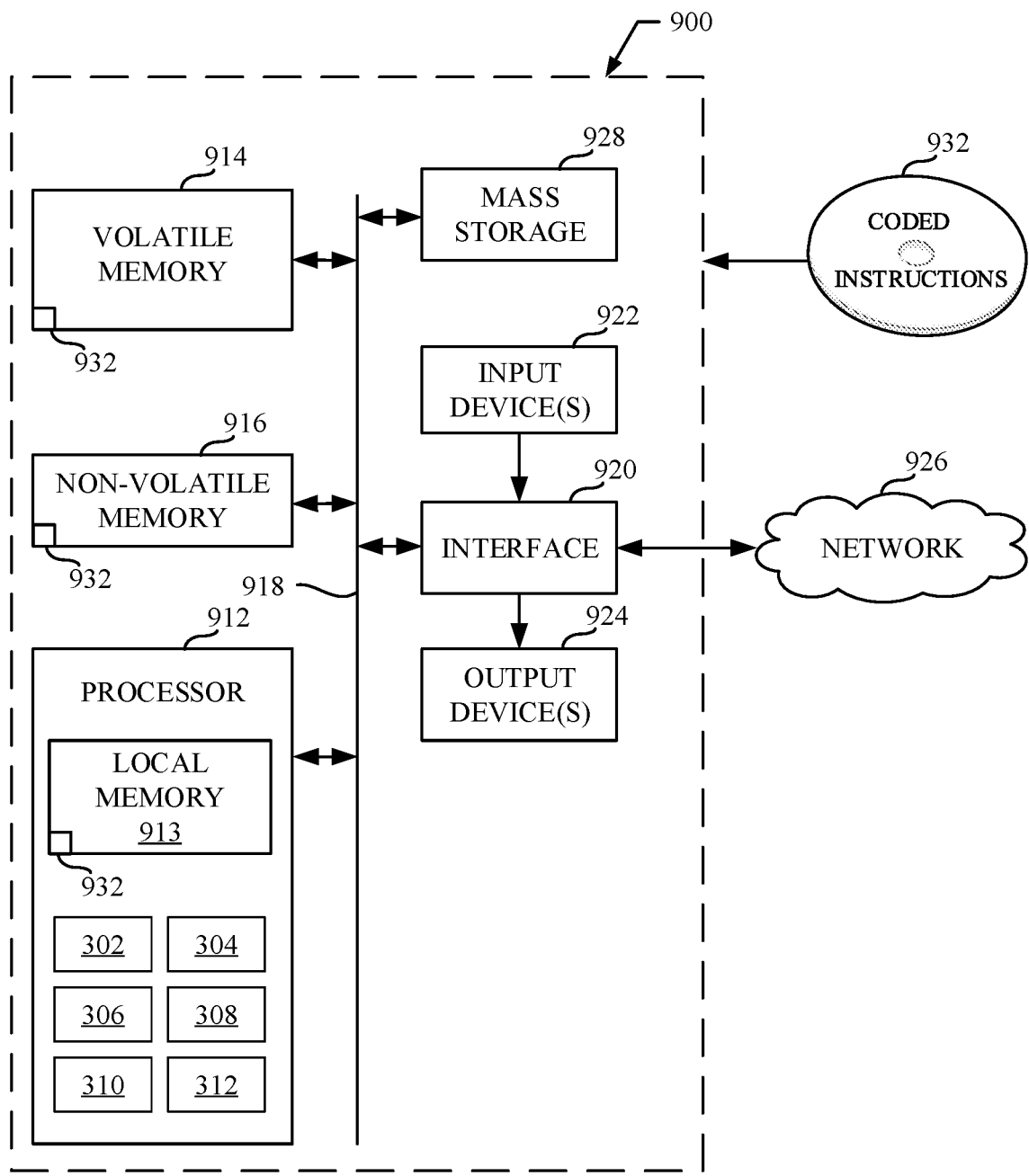
FIG. 9 is a block diagram of an example processor platform structured to execute the instructions of FIG. 7 to implement the equalization network generator of FIGS. 1 and/or 3.

FIG. 9 is a block diagram of an example processor platform 900 structured to execute the instructions of FIG. 7 to implement the equalization network generator 112 of FIGS. 1 and/or 3. The processor platform 900 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 900 of the illustrated example includes a processor 912. The processor 912 of the illustrated example is hardware. For example, the processor 912 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example input processor 302, the example model trainer 304, the example training data datastore 306, the example training model executor 308, the example output handler 310, and/or the example model data datastore 312.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), a Bluetooth® interface, a near field communication (NFC) interface, and/or a PCI express interface.

In the illustrated example, one or more input devices 922 are connected to the interface circuit 920. The input device(s) 922 permit(s) a user to enter data and/or commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 920 of the illustrated example, thus, typically includes a graphics driver card, a graphics driver chip and/or a graphics driver processor.

The interface circuit 920 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 926. The communication can be via, for example, an Ethernet connection, a digital subscriber line (DSL) connection, a telephone line connection, a coaxial cable system, a satellite system, a line-of-site wireless system, a cellular telephone system, etc.

The processor platform 900 of the illustrated example also includes one or more mass storage devices 928 for storing software and/or data. Examples of such mass storage devices 928 include floppy disk drives, hard drive disks, compact disk drives, Blu-ray disk drives, redundant array of independent disks (RAID) systems, and digital versatile disk (DVD) drives.

The machine executable instructions 932, 700 of FIG. 7 may be stored in the mass storage device 928, in the volatile memory 914, in the non-volatile memory 916, and/or on a removable non-transitory computer readable storage medium such as a CD or DVD.

From the foregoing, it will be appreciated that example methods, apparatus and articles of manufacture have been disclosed that adjust audio equalization settings responsive to a user preference input. The disclosed methods, apparatus and articles of manufacture improve the efficiency of using a computing device by utilizing a single neural network model, trained on a plurality of reference audio signals and a plurality of equalization curves, each associated with a variant of music, to efficiently equalize an audio signal based on a user input. Examples disclosed herein include adjusting weights of a first layer of the neural network model based on a user input. In examples disclosed herein, if the user input identifies a music variant such as, for example, "Rock," weights of the equalization curves generated by audio engineers known to listen to mainly "Rock" may be adjusted (e.g., increased) to account for the user input. In this manner, a single neural network model trained on a plurality of different audio signals and/or equalization curves, can be utilized to tailor equalization adjustments based on a user input. The disclosed methods, apparatus and articles of manufacture are accordingly directed to one or more improvement(s) in the functioning of a computer.

Example methods, apparatus, systems, and articles of manufacture for audio equalization based on variant selection are disclosed herein. Further examples and combinations thereof include the following:

Example 1 includes an apparatus comprising a processor to obtain training data, the training data including a plurality of reference audio signals each associated with a variant of music, and organize the training data into a plurality of entries based on the plurality of reference audio signals, a training model executor to execute a neural network model using the training data, and a model trainer to train the neural network model by updating at least one weight corresponding to one of the entries in the training data when the neural network model does not satisfy a training threshold.

Example 2 includes the apparatus of example 1, further including an output handler to transmit the neural network model to a media unit in an automobile when the neural network model satisfies the training threshold.

Example 3 includes the apparatus of example 1, wherein the training model executor is to execute the neural network model after the model trainer updates the at least one weight corresponding to one of the entries.

Example 4 includes the apparatus of example 1, wherein the variant of music is a music genre.

Example 5 includes the apparatus of example 1, wherein a number of the plurality of entries is equivalent to a number of the plurality of reference audio signals, and wherein the training data further includes a plurality of equalization curves each associated with at least one of the plurality of reference audio signals.

Example 6 includes the apparatus of example 1, wherein the model trainer is to store the neural network model in a database when the training threshold is satisfied, the neural network model accessible by a media unit in an automobile.

Example 7 includes the apparatus of example 1, wherein the training data includes a plurality of tags associated with the plurality of reference audio signals, the plurality of tags indicating one or more audio engineers associated with the plurality of reference audio signals.

Example 8 includes a non-transitory computer readable storage medium comprising instructions which, when executed, cause at least one processor to at least obtain training data, the training data including a plurality of reference audio signals each associated with a variant of music, organize the training data into a plurality of entries based on the plurality of reference audio signals, execute a neural network model using the training data, and train the neural network model by updating at least one weight corresponding to one of the entries in the training data when the neural network model does not satisfy a training threshold.

Example 9 includes the non-transitory computer readable storage medium of example 8, wherein the instructions, when executed, further cause the at least one processor transmit the neural network model to a media unit in an automobile when the neural network model satisfies the training threshold.

Example 10 includes the non-transitory computer readable storage medium of example 8, wherein the instructions, when executed, cause the one or more processors to execute the neural network model after at least one weight corresponding to one of the entries is updated.

Example 11 includes the non-transitory computer readable storage medium of example 8, wherein the variant of music is a music genre.

Example 12 includes the non-transitory computer readable storage medium of example 8, wherein a number of the plurality of entries is equivalent to a number of the plurality of reference audio signals, and wherein the training data further includes a plurality of equalization curves each associated with at least one of the plurality of reference audio signals.

Example 13 includes the non-transitory computer readable storage medium of example 8, wherein the instructions, when executed, further cause the one or more processors to store the neural network model in a database when the training threshold is satisfied, the neural network model accessible by a media unit in an automobile.

Example 14 includes the non-transitory computer readable storage medium of example 8, wherein the training data includes a plurality of tags associated with the plurality of reference audio signals, the plurality of tags indicating one or more audio engineers associated with the plurality of reference audio signals.

Example 15 includes a method comprising obtaining training data, the training data including a plurality of reference audio signals each associated with a variant of music, organizing the training data into a plurality of entries based on the plurality of reference audio signals, executing a neural network model using the training data, and training the neural network model by updating at least one weight corresponding to one of the entries in the training data when the neural network model does not satisfy a training threshold.

Example 16 includes the method of example 15, further including transmitting the neural network model to a media unit in an automobile when the neural network model satisfies the training threshold.

Example 17 includes the method of example 15, further including executing the neural network model after at least one weight corresponding to one of the entries is updated.

Example 18 includes the method of example 15, wherein the variant of music is a music genre.

Example 19 includes the method of example 15, wherein a number of the plurality of entries is equivalent to a number of the plurality of reference audio signals, and wherein the training data further includes a plurality of equalization curves each associated with at least one of the plurality of reference audio signals.

Example 20 includes the method of example 15, further including storing the neural network model in a database when the training threshold is satisfied, the neural network model accessible by a media unit in an automobile.

Example 21 includes the method of example 15, wherein the training data includes a plurality of tags associated with the plurality of reference audio signals, the plurality of tags indicating one or more audio engineers associated with the plurality of reference audio signals.

Example 22 includes an apparatus comprising means for processing to obtain training data, the training data including a plurality of reference audio signals each associated with a variant of music, and organize the training data into a plurality of entries based on the plurality of reference audio signals, means for executing a neural network model using the training data, and means for training a neural network model by updating at least one weight corresponding to one of the entries in the training data when the neural network model does not satisfy a training threshold.

Example 23 includes the apparatus of example 22, further including means for transmitting the neural network model to a media unit in an automobile when the neural network model satisfies the training threshold.

Example 24 includes the apparatus of example 22, wherein the means for executing is to execute the neural network model after at least one weight corresponding to one of the entries is updated.

Example 25 includes the apparatus of example 22, wherein the variant of music is a music genre.

Example 26 includes the apparatus of example 22, wherein a number of the plurality of entries is equivalent to a number of the plurality of reference audio signals, and wherein the training data further includes a plurality of equalization curves each associated with at least one of the plurality of reference audio signals.

Example 27 includes the apparatus of example 22, wherein the means for training is to store the neural network model in a database when the training threshold is satisfied, the neural network model accessible by a media unit in an automobile.

Example 28 includes the apparatus of example 22, wherein the training data includes a plurality of tags associated with the plurality of reference audio signals, the plurality of tags indicating one or more audio engineers associated with the plurality of reference audio signals.

Example 29 includes an apparatus to generate equalization adjustments for an audio signal based on a user input, the apparatus comprising a user interface to prompt a user for the user input corresponding to a selected variant of music, and an input feature set generator to generate an equalization input feature set, the equalization input feature set to be used by a model executor to adjust at least one weight of a neural network model to generate example equalization adjustments for the audio signal based on the user input, the equalization input feature set generated by generating a data structure corresponding to the user input, the data structure including a number of entries identifying the selected variant of music, and including the data structure in the equalization input feature set.

Example 30 includes the apparatus of example 29, wherein the number of entries is a first number of entries included in a second number of entries, each of the second number of entries corresponding to an audio engineer, the audio engineers associated with a respective variant of music.

Example 31 includes the apparatus of example 30, wherein the input feature set generator is to generate the data structure by adjusting a second weight of number of entries when the selected variant of music corresponds to the respective variant of music associated with the number of entries.

Example 32 includes the apparatus of example 29, wherein the selected variant of music is a music genre.

Example 33 includes the apparatus of example 29, wherein the user interface is a graphical user interface located in an automobile.

Example 34 includes the apparatus of example 29, wherein the user input includes a second selected variant of music.

Example 35 includes the apparatus of example 29, further including a time to frequency domain converter to output a frequency-domain representation of the audio signal.

Example 36 includes a non-transitory computer readable storage medium comprising instructions which, when executed, cause at least one processor to at least prompt a user for a user input corresponding to a selected variant of music, and generate an equalization input feature set, the equalization input feature set to be used by a model executor to adjust at least one weight of a neural network model to generate example equalization adjustments for an audio signal based on the user input, the equalization input feature set generated by generating a data structure corresponding to the user input, the data structure including a number of entries identifying the selected variant of music, and including the data structure in the equalization input feature set.

Example 37 includes the non-transitory computer readable storage medium of example 36, wherein the number of entries is a first number of entries included in a second number of entries, each of the second number of entries corresponding to an audio engineer, the audio engineers associated with a respective variant of music.

Example 38 includes the non-transitory computer readable storage medium of example 37, wherein the instructions, when executed, cause the at least one processor to generate the data structure by adjusting a second weight of number of entries when the selected variant of music corresponds to the respective variant of music associated with the number of entries.

Example 39 includes the non-transitory computer readable storage medium of example 36, wherein the selected variant of music is a music genre.

Example 40 includes the non-transitory computer readable storage medium of example 36, wherein the instructions, when executed, cause the at least one processor to obtain the user input via a graphical user interface located in an automobile.

Example 41 includes the non-transitory computer readable storage medium of example 36, wherein the user input includes a second selected variant of music.

Example 42 includes the non-transitory computer readable storage medium of example 36, wherein the instructions, when executed, cause the at least one processor to output a frequency-domain representation of the audio signal.

Example 43 includes a method to generate equalization adjustments for an audio signal based on a user input, the method comprising prompting a user for the user input corresponding to a selected variant of music, and generating an equalization input feature set, the equalization input feature set to be used by a model executor to adjust at least one weight of a neural network model to generate example equalization adjustments for the audio signal based on the user input, the equalization input feature set generated by generating a data structure corresponding to the user input, the data structure including a number of entries identifying the selected variant of music, and including the data structure in the equalization input feature set.

Example 44 includes the method of example 43, wherein the number of entries is a first number of entries included in a second number of entries, each of the second number of entries corresponding to an audio engineer, the audio engineers associated with a respective variant of music.

Example 45 includes the method of example 44, further including generating the data structure by adjusting a second weight of number of entries when the selected variant of music corresponds to the respective variant of music associated with the number of entries.

Example 46 includes the method of example 43, wherein the selected variant of music is a music genre.

Example 47 includes the method of example 43, wherein prompting the user for the user input is via is a graphical user interface located in an automobile.

Example 48 includes the method of example 43, wherein the user input includes a second selected variant of music.

Example 49 includes the method of example 43, further including a time to frequency domain converter to output a frequency-domain representation of the audio signal.

Example 50 includes an apparatus comprising means for prompting a user for a user input corresponding to a selected variant of music, and means for generating an equalization input feature set, the equalization input feature set to be used by a model executor to adjust at least one weight of a neural network model to generate example equalization adjustments for an audio signal based on the user input, the equalization input feature set generated by generating a data structure corresponding to the user input, the data structure including a number of entries identifying the selected variant of music, and including the data structure in the equalization input feature set.

Example 51 includes the apparatus of example 50, wherein the number of entries is a first number of entries included in a second number of entries, each of the second number of entries corresponding to an audio engineer, the audio engineers associated with a respective variant of music.

Example 52 includes the apparatus of example 51, wherein the means for generating is to generate the data structure by adjusting a second weight of number of entries when the selected variant of music corresponds to the respective variant of music associated with the number of entries.

Example 53 includes the apparatus of example 50, wherein the selected variant of music is a music genre.

Example 54 includes the apparatus of example 50, wherein prompting the user for the user input is via a graphical user interface located in an automobile.

Example 55 includes the apparatus of example 50, wherein the user input includes a second selected variant of music.

Example 56 includes the apparatus of example 50, further including means for frequency converting to output a frequency-domain representation of the audio signal.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
   a processor to:
      obtain training data, the training data including a plurality of reference audio signals each associated with a variant of music; and
      organize the training data into a plurality of entries based on the plurality of reference audio signals;
   a training model executor to execute a neural network model using the training data; and
   a model trainer to train the neural network model by updating at least one weight corresponding to one of the entries in the training data when the neural network model does not satisfy a training threshold.

2. The apparatus of claim 1, further including an output handler to transmit the neural network model to a media unit in an automobile when the neural network model satisfies the training threshold.

3. The apparatus of claim 1, wherein the training model executor is to execute the neural network model after the model trainer updates the at least one weight corresponding to one of the entries.

4. The apparatus of claim 1, wherein the variant of music is a music genre.

5. The apparatus of claim 1, wherein a number of the plurality of entries is equivalent to a number of the plurality of reference audio signals, and wherein the training data further includes a plurality of equalization curves each associated with at least one of the plurality of reference audio signals.

6. The apparatus of claim 1, wherein the model trainer is to store the neural network model in a database when the training threshold is satisfied, the neural network model accessible by a media unit in an automobile.

7. The apparatus of claim 1, wherein the training data includes a plurality of tags associated with the plurality of reference audio signals, the plurality of tags indicating one or more audio engineers associated with the plurality of reference audio signals.

8. A non-transitory computer readable storage medium comprising instructions which, when executed, cause at least one processor to at least:
  obtain training data, the training data including a plurality of reference audio signals each associated with a variant of music;
  organize the training data into a plurality of entries based on the plurality of reference audio signals;
  execute a neural network model using the training data; and
  train the neural network model by updating at least one weight corresponding to one of the entries in the training data when the neural network model does not satisfy a training threshold.

9. The non-transitory computer readable storage medium of claim 8, wherein the instructions, when executed, further cause the at least one processor transmit the neural network model to a media unit in an automobile when the neural network model satisfies the training threshold.

10. The non-transitory computer readable storage medium of claim 8, wherein the instructions, when executed, cause the at least one processor to execute the neural network model after at least one weight corresponding to one of the entries is updated.

11. The non-transitory computer readable storage medium of claim 8, wherein the variant of music is a music genre.

12. The non-transitory computer readable storage medium of claim 8, wherein a number of the plurality of entries is equivalent to a number of the plurality of reference audio signals, and wherein the training data further includes a plurality of equalization curves each associated with at least one of the plurality of reference audio signals.

13. The non-transitory computer readable storage medium of claim 8, wherein the instructions, when executed, further cause the at least one processor to store the neural network model in a database when the training threshold is satisfied, the neural network model accessible by a media unit in an automobile.

14. The non-transitory computer readable storage medium of claim 8, wherein the training data includes a plurality of tags associated with the plurality of reference audio signals, the plurality of tags indicating one or more audio engineers associated with the plurality of reference audio signals.

15. A method comprising:
  obtaining training data, the training data including a plurality of reference audio signals each associated with a variant of music;
  organizing the training data into a plurality of entries based on the plurality of reference audio signals;
  executing a neural network model using the training data; and
  training the neural network model by updating at least one weight corresponding to one of the entries in the training data when the neural network model does not satisfy a training threshold.

16. The method of claim 15, further including transmitting the neural network model to a media unit in an automobile when the neural network model satisfies the training threshold.

17. The method of claim 15, further including executing the neural network model after at least one weight corresponding to one of the entries is updated.

18. The method of claim 15, wherein the variant of music is a music genre.

19. The method of claim 15, wherein a number of the plurality of entries is equivalent to a number of the plurality of reference audio signals, and wherein the training data further includes a plurality of equalization curves each associated with at least one of the plurality of reference audio signals.

20. The method of claim 15, further including storing the neural network model in a database when the training threshold is satisfied, the neural network model accessible by a media unit in an automobile.

21. The method of claim 15, wherein the training data includes a plurality of tags associated with the plurality of reference audio signals, the plurality of tags indicating one or more audio engineers associated with the plurality of reference audio signals.

22. An apparatus comprising:
  means for processing to:
    obtain training data, the training data including a plurality of reference audio signals each associated with a variant of music; and
    organize the training data into a plurality of entries based on the plurality of reference audio signals;
  means for executing a neural network model using the training data; and
  means for training the neural network model by updating at least one weight corresponding to one of the entries in the training data when the neural network model does not satisfy a training threshold.

23. The apparatus of claim 22, further including means for transmitting the neural network model to a media unit in an automobile when the neural network model satisfies the training threshold.

24. The apparatus of claim 22, wherein the means for executing is to execute the neural network model after at least one weight corresponding to one of the entries is updated.

25. The apparatus of claim 22, wherein the variant of music is a music genre.

26. The apparatus of claim 22, wherein a number of the plurality of entries is equivalent to a number of the plurality of reference audio signals, and wherein the training data further includes a plurality of equalization curves each associated with at least one of the plurality of reference audio signals.

27. The apparatus of claim 22, wherein the means for training is to store the neural network model in a database when the training threshold is satisfied, the neural network model accessible by a media unit in an automobile.

28. The apparatus of claim 22, wherein the training data includes a plurality of tags associated with the plurality of reference audio signals, the plurality of tags indicating one or more audio engineers associated with the plurality of reference audio signals.

* * * * *